US009502587B2

(12) United States Patent
Bitnar et al.

(10) Patent No.: US 9,502,587 B2
(45) Date of Patent: Nov. 22, 2016

(54) SOLAR CELL AND METHOD OF MANUFACTURING

(71) Applicant: SolarWorld Innovations GmbH, Freiburg (DE)

(72) Inventors: Bernd Bitnar, Bannewitz (DE); Marc Dietrich, Grossschirma (DE); Matthias Georgi, Dresden (DE)

(73) Assignee: SOLARWORLD INNOVATIONS GMBH, Freiberg (DE)

( * ) Notice: Subject to any disclaimer, the term of this patent is extended or adjusted under 35 U.S.C. 154(b) by 520 days.

(21) Appl. No.: 13/956,459

(22) Filed: Aug. 1, 2013

(65) Prior Publication Data

US 2014/0034123 A1   Feb. 6, 2014

(30) Foreign Application Priority Data

Aug. 1, 2012  (DE) .................. 10 2012 107 026

(51) Int. Cl.
*H01L 31/00* (2006.01)
*H01L 21/66* (2006.01)
(Continued)

(52) U.S. Cl.
CPC ....... *H01L 31/02021* (2013.01); *H01L 31/028* (2013.01); *H01L 31/0256* (2013.01);
(Continued)

(58) Field of Classification Search
CPC ............... H01L 31/02021; H01L 31/03682; H01L 31/02167; H01L 31/022425; H01L 31/1804; H01L 31/022433; H01L 31/028; H01L 31/068; H01L 31/0256
USPC ............................................ 136/256; 438/17
See application file for complete search history.

(56) References Cited

U.S. PATENT DOCUMENTS 4,218,650 A * 8/1980 Frosch ................... G01R 27/02
  136/290
2009/0272419 A1* 11/2009 Sakamoto ......... H01L 31/02168
  136/244

(Continued)

FOREIGN PATENT DOCUMENTS

CN          1589477 A    3/2005
CN        102414830 A    4/2012
(Continued)

OTHER PUBLICATIONS

Martin et al., "Laser fired contacts applied to the rear surface of heterojunction silicon solar cells," Solar Energy Materials and Solar Cells, vol. 95, Issue 11, Nov. 2011, pp. 3119-3123.*
(Continued)

*Primary Examiner* — Luan Van
*Assistant Examiner* — Angelo Trivisonno
(74) *Attorney, Agent, or Firm* — Viering, Jentschura & Partner mbB

(57) ABSTRACT

In different exemplary embodiments, a solar cell is provided, including: a substrate with a first region and a second region, wherein the first region includes at least a first electrical conductivity and the second region includes at least a second electrical conductivity which is greater than the first electrical conductivity; and a passivation on the surface of the substrate; and a contact-structure on the surface of the substrate, wherein the contact-structure includes a plurality of contacts; wherein two contacts of the plurality of contacts are disposed at a first distance with respect to each other in the first region; wherein two further contacts of the plurality of contacts are disposed at a second distance with respect to each other in the second region; and wherein the second distance is greater than the first distance.

14 Claims, 12 Drawing Sheets

(51) Int. Cl.

| | |
|---|---|
| *G01R 31/26* | (2014.01) |
| *H01L 31/02* | (2006.01) |
| *H01L 31/0256* | (2006.01) |
| *H01L 31/0216* | (2014.01) |
| *H01L 31/0224* | (2006.01) |
| *H01L 31/028* | (2006.01) |
| *H01L 31/0368* | (2006.01) |
| *H01L 31/068* | (2012.01) |
| *H01L 31/18* | (2006.01) |

(52) U.S. Cl.
CPC . *H01L31/02167* (2013.01); *H01L 31/022425* (2013.01); *H01L 31/022433* (2013.01); *H01L 31/03682* (2013.01); *H01L 31/068* (2013.01); *H01L 31/1804* (2013.01); *Y02E 10/546* (2013.01); *Y02E 10/547* (2013.01); *Y02P 70/521* (2015.11)

(56) References Cited

U.S. PATENT DOCUMENTS

2010/0178718 A1   7/2010   Kelman et al.
2011/0297223 A1*  12/2011  Krause .................... C30B 11/14
                                                       136/256
2012/0048369 A1*  3/2012   Kobamoto ...... H01L 31/022433
                                                       136/256
2012/0125420 A1*  5/2012   Karakida ........ H01L 31/022433
                                                       136/255

FOREIGN PATENT DOCUMENTS

| CN | 202219636 U | 5/2012 |
| EP | 2482327 A2 | 8/2012 |
| WO | 03043013 A1 | 5/2003 |

OTHER PUBLICATIONS

Chinese Office Action based on Application No. 201310332756.1(7 Pages) dated Aug. 25, 2015 (Reference Purpose Only).
Ohrdes, T., et al., High Fill-Factors of Back-Junction Solar Cells Without Front Surface Field Diffusion, EPVSEC, Frankfurt, Germany, Sep. 24-28, 2012, 2DO. 3.5.
Engelhart, P., et al., Laser Ablation of Passivating SINx Layers for Locally Contacting Emitters of High-Efficiency Solar Cells, Proceedings 4th World Conference on Photovoltaic Energy Conversion (WCPEC), IEEE, 3, 2006, pp. 1024-1027—ISSN 4244-0016.
Blakers, A. W., et al.,22.8% efficient silicon solar cell, Appl. Phys. Lett. 55, University of New South Wales, Kensington 2033, Australia, Sep. 25, 1989, pp. 1363-1365.

* cited by examiner

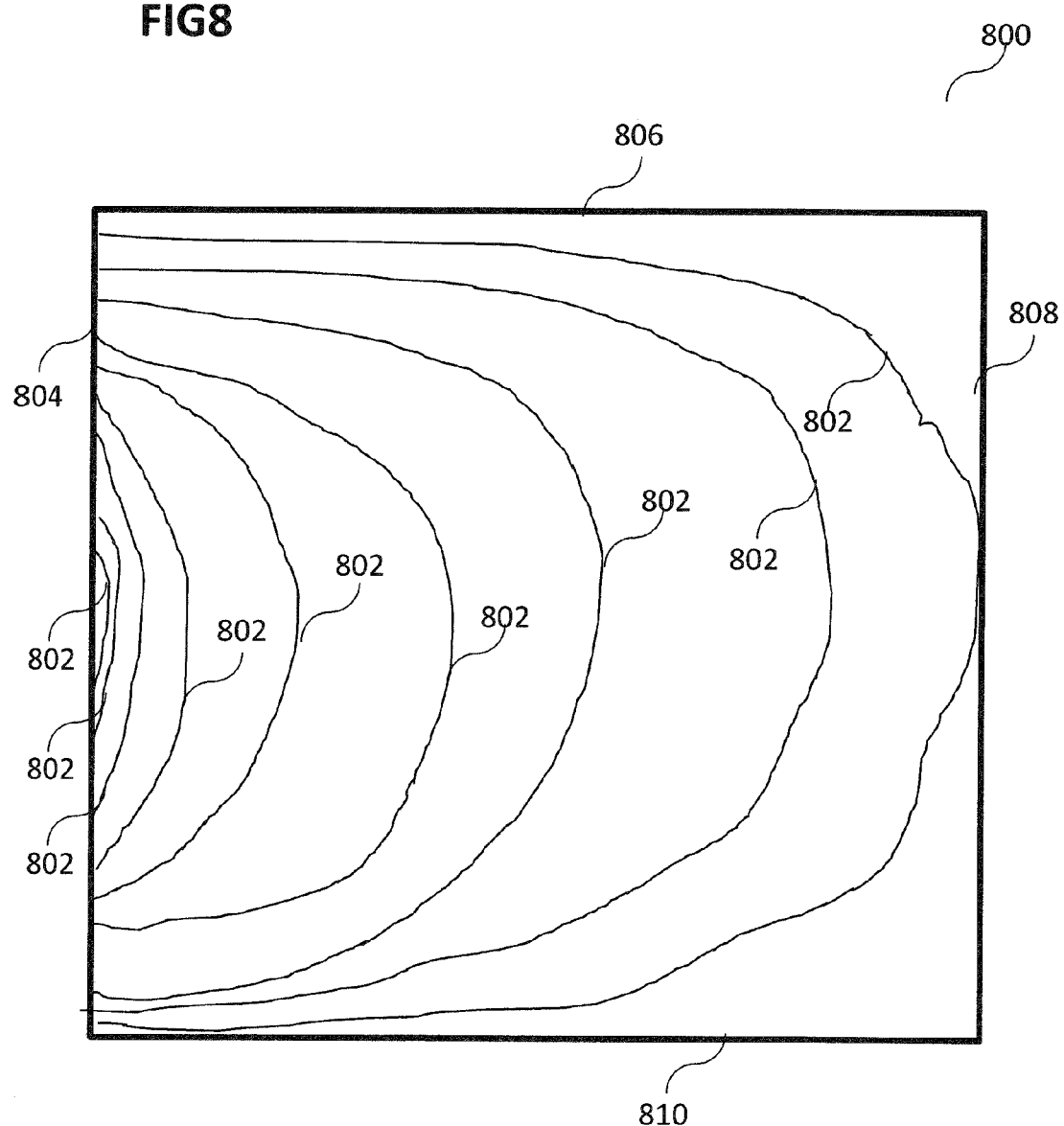

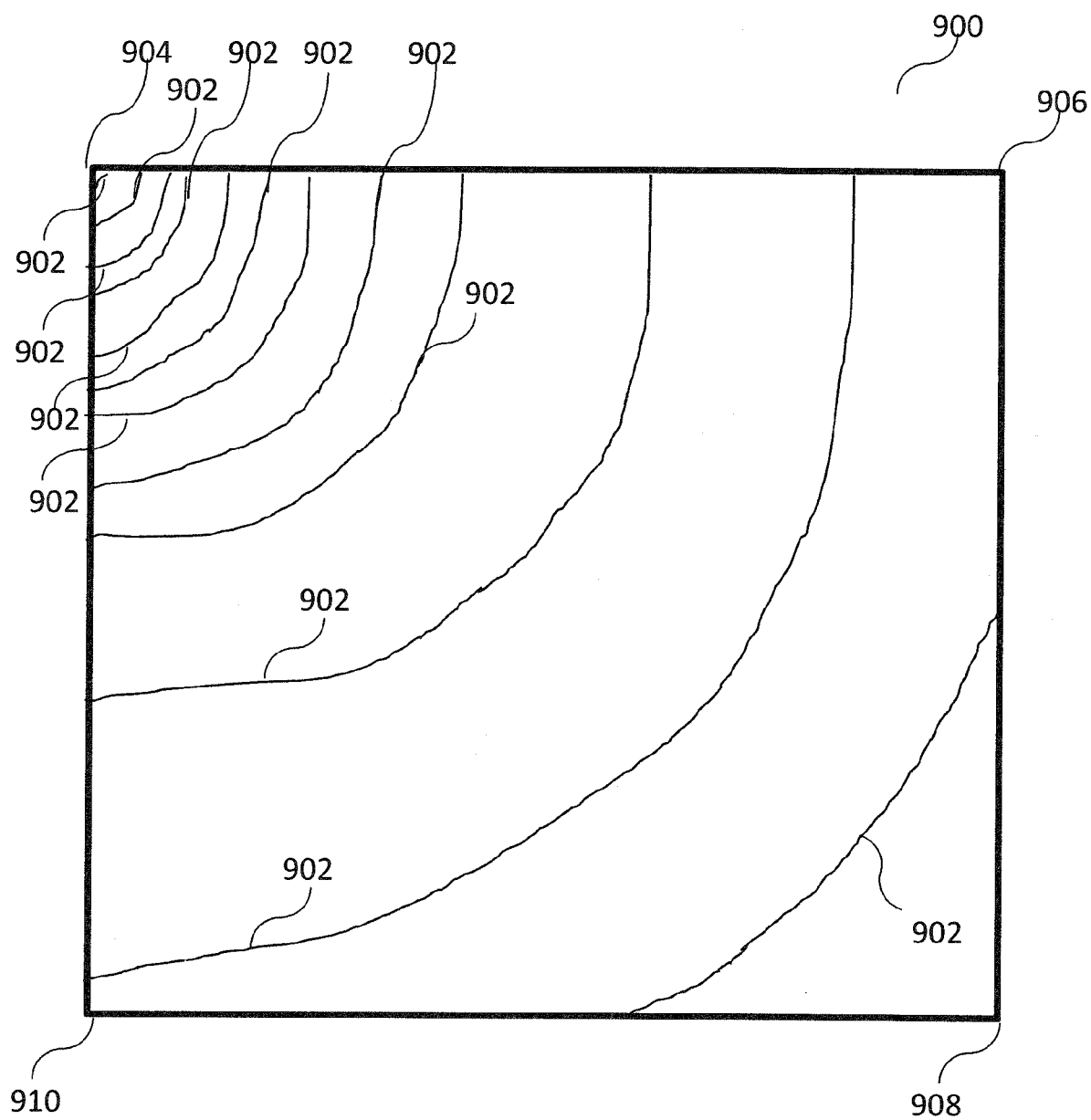

SOLAR CELL AND METHOD OF MANUFACTURING

The invention relates to a solar cell and a method for manufacturing a solar cell.

In solar cell-wafers made of quasi-mono (quasi-monocrystalline) silicon, normally a linear gradient of the dopant-concentration occurs, if this is sawn vertically from a silicon block. This leads to that the specific resistance varies along the surface of the wafer. The problem primarily occurs in n-type wafers and in p-type wafers, which are based on a so-called UMG-material (UMG: Upgraded Metallurgical Grade) and therefore, normally also phosphorous.

Furthermore, a so-called PERC-solar cell (PERC: Passivated Emitter and Rear-side Solar cell) is known. In such a solar cell, the emitter at the front-side as well as the base at the rear-side of the solar cells is passivated largely by dielectric coatings. The metal paste, for instance—made of Aluminium normally introduced by means of screen-printing technology over the full working area, may contact the base only locally in those areas, in which the dielectric coatings were previously removed. Normally, at the front-side of such a solar cell, an emitter is located, which is contacted by means of a metal containing screen-printing paste.

Further, in such a solar cell, the emitter is at the rear-side of the solar cell, therefore, may be fitted on the side which is opposite the incident light side, wherein the emitter at the rear-side as well as the base at the front-side of the solar cell may largely be passivated by dielectric coatings. The metal paste, for instance made from Aluminium, introduced by means of screen-printing technology over the full or partial working area may contact the base and/or the emitter only locally in those areas, in which the dielectric coatings were previously removed. Normally, at the rear-side of such a solar cell, an emitter is located, which is contacted by means of a metal containing screen-printing paste.

In different exemplary embodiments, series resistance-losses which result at the front-side and/or at the rear-side of a PERC-solar cell in which the specific material resistance varies over the wafer surface, are reduced or obviated. Further, the resistance-losses may be reduced or obviated, which result at the front-side and/or rear-side of a solar cell with passivated emitter and/or passivated contacts, if the electrical conductivity of the material of the substrate varies in the regions on which the contacts abut.

According to different exemplary embodiments, a solar cell may include the following: a substrate with a first region and a second region, wherein the first region includes at least a first electrical conductivity and the second region includes at least a second electrical conductivity, wherein the second electrical conductivity is greater than the first electrical conductivity; a passivation (or passivation layer) on a surface of the substrate (or on a first side of the substrate); and a contact-structure on the surface of the substrate, wherein the contact-structure includes a plurality of contacts; wherein two (for instance—adjacent) contacts of the plurality of contacts are disposed at a first distance with respect to each other in the first region; wherein two further (for instance—adjacent) contacts of the plurality of contacts are disposed at a second distance with respect to each other in the second region; and wherein the second distance is greater than the first distance.

According to different exemplary embodiments, the substrate may include a dopant profile, which varies along the surface of the substrate.

Further, according to different exemplary embodiments, the passivation may include a plurality of openings; wherein a respective contact is provided in a respective opening of the passivation in such a manner that the respective contact electrically contacts the surface of the substrate.

Further, a plurality of regions of the substrate may be exposed by means of the plurality of openings, wherein at least two regions of the plurality of may include different electrical conductivities.

According to different exemplary embodiments, the contacts may be configured at least partially linearly and at least partially point shaped. According to different exemplary embodiments, the contacts may be configured at least partially linearly or at least partially point shaped.

According to different exemplary embodiments, the contacts-structure may include Laser-fired contacts.

According to different exemplary embodiments, the passivation may include Laser-ablated regions, in which the contact-structure may be disposed.

According to different exemplary embodiments, the substrate may include a third region, wherein the third region includes at least a third electrical conductivity, which is greater than the second electrical conductivity; and wherein two further (for instance—adjacent) contacts are disposed at a third distance with respect to each other in the third region; and wherein the third distance is greater than the second distance.

According to different exemplary embodiments, the passivation may be a rear-side passivation, wherein the surface of the substrate is a rear-side of the substrate, wherein the contact-structure is a rear-side contact-structure, and wherein the contact is a rear-side contact.

Further, according to different exemplary embodiments, the solar cell may include an emitter structure at the front-side of the substrate, wherein the emitter structure forms a p-n-junction with the substrate.

According to different exemplary embodiments, the passivation may be a front-side passivation, wherein the surface of the substrate is a front-side of the substrate, wherein the contact-structure is a front-side contact structure, and wherein the contact is a front-side contact.

Further, according to different exemplary embodiments, the solar cell may include an emitter structure at the rear-side of the substrate, which forms a p-n-junction with the substrate.

According to different exemplary embodiments, the method for manufacturing a solar cell may include the following steps: determining a first electrical conductivity in a first region of a substrate; determining a second electrical conductivity in a second region of the substrate, wherein the second electrical conductivity is greater than the first electrical conductivity; forming a passivation on a surface of the substrate; and forming a contact-structure on the surface of the substrate, wherein the contact-structure includes a plurality of contacts, which are surrounded by regions of the substrate with passivation, wherein the distances of the contacts with respect to each other are defined depending on the first electrical conductivity and the second electrical conductivity.

According to different exemplary embodiments, the method for manufacturing a solar cell may be configured in such a manner that the substrate may include a {100}-crystal orientation.

According to different exemplary embodiments, in the passivation, a plurality of openings and a respective contact in a respective opening of the passivation are formed in such a manner that the respective contact electrically contacts the surface of the substrate.

According to different exemplary embodiments, the contacts may be configured as Laser-fired contacts.

According to different exemplary embodiments, the passivation may be structured by means of Laser-Ablation.

According to different exemplary embodiments, the method for manufacturing a solar cell may include: determining a first electrical conductivity in a first region of a substrate; determining a second electrical conductivity in a second region of the substrate, wherein the second electrical conductivity is greater than the first electrical conductivity; forming a rear-side passivation at a rear-side of the substrate; and forming a rear-side contact-structure on the rear-side of the substrate, wherein the rear-side contact-structure includes a plurality of rear-side contacts, which are surrounded by regions of the substrate with rear-side passivation, wherein the distances of the rear-side contacts with respect to each other are defined depending on the first electrical conductivity and the second electrical conductivity.

According to different exemplary embodiments, the method for manufacturing a solar cell may include: determining a first electrical conductivity in a first region of a substrate; determining a second electrical conductivity in a second region of the substrate, wherein the second electrical conductivity is greater than the first electrical conductivity; forming a front-side passivation at a front-side of the substrate; and forming a front-side contact-structure at the front-side of the substrate, wherein the front-side contact-structure includes a plurality of front-side contacts, which are surrounded by regions of the substrate with front-side passivation, wherein the distances of the front-side contacts with respect to each other are defined depending on the first electrical conductivity and the second electrical conductivity.

Clearly, the resistance-losses at the front-side and/or rear-side of a solar cell (e.g. a PERC-solar cell or a solar cell with passivated emitter and passivated contact-structure) made of quasi-monocrystalline silicon are reduced, while for instance, the distances of rear-side contacts along the wafer rear-side vary and/or while for instance, the distances of front-side contacts along the wafer front-side vary, for instance—depending on the electrical conductivity of the wafer, for instance—of the base region of the solar cell. Clearly, it was recognized that in a solar cell made of quasi-monocrystalline silicon, the electrical conductivity varies along the substrate (for instance in a vertically sawn wafer made from a wafer block, for instance—in a wafer with a {100}-crystal orientation). This knowledge was further used in different exemplary embodiments, in order to vary the distances of front-side contacts and/or rear-side contacts depending thereon, for instance—in such a manner that the higher is the electrical conductivity of the substrate or wafer in a front-side region and/or rear-side region, the greater may be the distance selected between two front-side contacts and/or rear-side contacts. Conversely, front-side contacts and/or rear-side contacts may be disposed in such a manner that the lower is the electrical conductivity of the substrate or wafer in a front-side region and/or rear-side region, the lower should be the distance selected between the two front-side contacts and/or two rear-side contacts. Thereby, the distance between the respective two adjacent contacts may be observed and/or considered.

In other words, in different exemplary embodiments, clearly, a quasi-mono PERC-solar cell with variable rear contact-pitch is provided. Further, in different exemplary embodiments, clearly, a quasi-mono solar cell with variable front contact-pitch (front-side contact distance) is provided.

In a configuration, the substrate may include a {100}-crystal orientation. Therefore, for instance—the substrate may be a quasi-monocrystalline wafer. With other words, the substrate may be textured, wherein the {100}-crystal orientation represents a preferred direction.

In yet another configuration, the substrate may include a dopant profile, which varies along the substrate front-side surface and/or along the substrate rear-side surface. For instance, the dopant profile may rise or fall monotonously from one edge of the substrate to an opposite edge of the substrate along the substrate front-side surface and/or along the substrate rear-side surface, for instance—may rise strictly monotonously or may fall strictly monotonously.

In still further configuration, front-side passivation and/or rear-side passivation may include a plurality of openings; wherein a respective front-side contact and/or rear-side contact is provided in a respective opening of the passivation in such a manner that the respective contact electrically contacts the front-side and/or the rear-side of the substrate.

In yet another configuration, the front-side contacts and/or rear-side contacts may be configured at least partially linearly and/or at least partially point shaped. Generally, the front-side contacts and/or rear-side contacts could however include any shape, therefore, they may be configured, for instance—even in meandering pattern, wave-line shape, or partially linear, interrupted by point contacts, alternatively with multiple line-segments disposed at an angle or at several angles with respect to each other. The front-side contacts and/or rear-side contacts may extend parallel or partially parallel to each other, however, they may also extend at an angle with respect to each other, for instance—star shaped, emanating from a specified region on the solar cells front-side and/or solar cells rear-side. Further, the front-side contacts and/or rear-side contacts may also extend annularly or arcuately, for instance the front-side contacts and/or rear-side contacts may include a plurality of ring structures, which are disposed side by side and/or concentric with respect to each other. Furthermore, the linear front-side contacts and/or rear-side contacts may be disposed rectilinearly or arcuately on the solar cells front-side and/or on the solar cells rear-side.

In yet another configuration, the substrate may be doped with p-dopant (for instance—Boron (B) or Gallium (Ga) or Aluminium (Al)) or with n-dopant (for instance—Phosphorous (P) or Arsenic (As)).

In yet another configuration, the front-side contact-structure and/or the rear-side contact-structure may include Laser-fired front-side contacts and/or rear-side contacts.

In yet another configuration, the passivation layer (the front-side passivation and/or the rear-side passivation) may include Laser-ablated regions, in which the contact-structure (front-side contact-structure and/or the rear-side contact-structure) is disposed.

In yet another configuration, the substrate includes a third region, wherein the third region includes at least a third electrical conductivity, which is greater than the second electrical conductivity. Further, two further front-side contacts and/or rear-side contacts may be disposed at a third distance with respect to each other in the third region; wherein the third distance is greater than the second distance. Furthermore, still further regions may be contained in the substrate, each with greater electrical conductivity, wherein the respective additional front-side contacts and/or rear-side contacts may be disposed at a respective distance with respect to each other in the regions at a respectively increasing distance with respect to each other.

It is important to note that in different exemplary embodiments, the respective regions may smoothly merge into each other, so that a (quasi-) continuing variation of the electrical conductivity of the substrate is present, and the front-side contacts and/or rear-side contacts take into account of this variation in the electrical conductivity by a varied distance of the front-side contacts and/or rear-side contacts with respect to each other.

In yet another configuration, the passivation (front-side passivation and/or rear-side passivation) includes an electrically insulating material, for instance—Nitride and/or Oxide, wherein the Nitride may include Silicon nitride; and/or wherein the Oxide may include Silicon oxide and/or wherein das insulating material may include Silicon oxynitride and/or wherein the insulating material may include Aluminium oxide.

In yet another configuration, the front-side contact-structure and/or the rear-side contact-structure may include metal, for instance—Aluminium or Silver.

In yet another configuration, in the front-side passivation and/or in the rear-side passivation, a plurality of openings may be configured; wherein a respective front-side contact and/or rear-side contact is formed in a respective opening of the rear-side passivation in such a manner that the respective front-side contact and/or rear-side contact electrically contact the front-side and/or the rear-side of the substrate.

In yet another configuration, the front-side contacts and/or rear-side contacts may be formed as Laser-fired front-side contacts and/or rear-side contacts.

In yet another configuration, the passivation layer may be structured by means of Laser-Ablation.

In yet another configuration, the substrate may be doped with a dopant profile, which varies along the substrate front-side surface and/or the substrate rear-side surface. Therefore, the dopant profile may be formed in such a manner that it may rise or fall monotonously from an edge of the substrate to an opposite edge of the substrate along the substrate front-side surface and/or the substrate rear-side surface, for instance—may rise or fall strictly monotonously.

In yet another configuration, the substrate may be doped with p-dopant (for instance Boron (B) or Gallium (Ga) or Aluminium (Al)) or with n-dopant (for instance Phosphorous (P) or Arsenic (As)).

In yet another configuration, in the front-side passivation and/or rear-side passivation, a plurality of openings may be formed; wherein a respective front-side contact and/or rear-side contact is formed in a respective opening of the front-side passivation and/or rear-side passivation, in such a manner that the respective front-side contact and/or rear-side contact electrically contacts the front-side and/or rear-side of the substrate.

In yet another configuration, the front-side passivation and/or the rear-side passivation may include an electrically insulating material, for instance—Nitride and/or Oxide, wherein the Nitride may include Silicon nitride; and/or wherein the Oxide may include Silicon oxide and/or wherein the insulating material may include Silicon oxynitride and/or wherein the insulating material may include Aluminium oxide.

In yet another configuration, the front-side contact-structure and/or the rear-side contact-structure may include metal, for instance—Aluminium or Silver.

In yet another configuration, the contacts may be configured at least partially linearly and/or at least partially point shaped. Generally, the contacts could however include any shape, therefore, they may be configured, for instance—even in meandering pattern, wave-line shape, or partially linear, interrupted by point contacts, alternatively with a plurality of line-segments disposed at an angle or a plurality of angles with respect to each other. The contacts may extend parallel or partially parallel with respect to each other, however they may also extend at an angle with respect to each other, for instance—star-shaped emanating from a specified region on the solar cells surface. Further, the contacts may also extend annularly, for instance—the rear-side contacts may include a plurality of ring structures, which are disposed side by side and/or concentric with respect to each other. Furthermore, the linear contacts may be disposed rectilinearly or arcuately on the solar cell surface.

Exemplary embodiments of the invention are represented in the figures and are described in more details in the following.

They show:

FIG. 8 shows a view from below at the rear-side on the solar cell, according to different exemplary embodiments;

FIG. 9 shows a view from below at the rear-side on the solar cell, according to different exemplary embodiments.

Figure 1A:
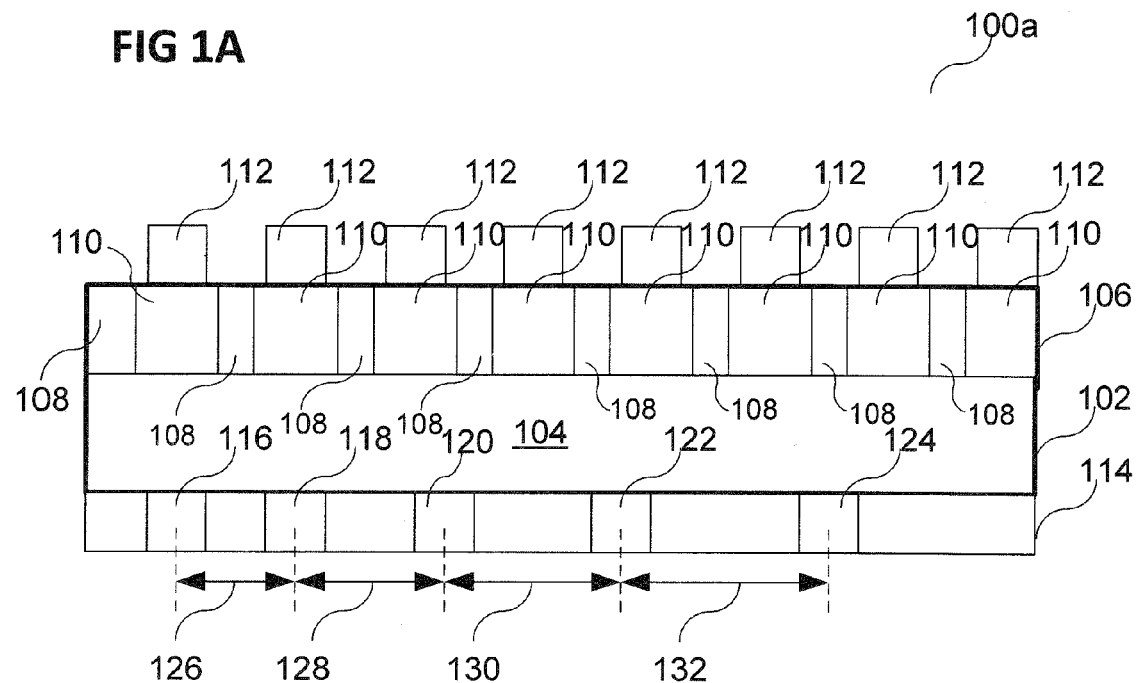
FIG. 1A shows a cross-sectional view of a solar cell according to different exemplary embodiments.

The following detailed description refers to the attached drawings, which form part of this and in which specific exemplary embodiments are shown for illustration, in which the invention can be exercised. In this regard, terminology for orientations, such as "above", "below", "front", "behind", "anterior", "posterior", etc. are used with reference to the orientation of the described Figure(s). Since the components of exemplary embodiments may be positioned in a number of different orientations, the terminology for orientation serves to illustrate and is not restricting in any way. It goes without saying that other exemplary embodiments may be used and structural or logical changes may be done, without departing from the scope of protection of the present invention. It goes without saying that the features of the different exemplary embodiments described herein, may be combined with each other, unless otherwise specifically stated. Therefore, the following detailed description is not to be considered in a restricting sense, and the scope of protection of the present invention is defined by the listed claims.

Within this description, the terms "connected", "attached" and "coupled" are used for describing a direct as well as an indirect connection, a direct or indirect attachment and a direct or indirect coupling. In the Figures, identical or similar elements with identical reference numerals are provided, wherever this is appropriate.

In different exemplary embodiments, for instance in vertically sawn solar cell wafers, for instance, in vertically sawn quasi-mono solar cell wafers (for instance, n-doped or p-doped), a reduction of the resistance losses is achieved at the front-side and/or rear-side of the solar cells made of such wafers.

As will be explained still in more details in the following, this is achieved in different exemplary embodiments, for instance by a variation of the distance from each other (for instance, of the so-called pitch (centre-to-centre distance)) of the local rear-side contacts and/or of the local front-side contacts over the wafer surface corresponding to the respective local value of the specific resistance.

FIG. 1A shows a cross-sectional view of solar cell 100a according to different exemplary embodiments.

In different exemplary embodiments, a solar cell includes a device, which can convert the radiation energy predominantly of visible light (for instance, at least a part of the light in the visible wavelength range of approximately 300 nm to approximately 1150 nm; it is important to note that additionally ultraviolet (UV)-radiation and/or infrared (IR)-radiation may also be converted), for instance from Sunlight is directly converted into electrical energy by means of the so-called photovoltaic effect.

In different exemplary embodiments, a solar module includes an electrically connectable device with several solar cells (which are interconnected in series and/or parallel), and optionally with a weather protection (for instance, glass), an embedding and a frame.

The solar cell 100a may include a homogeneous emitter or a selective emitter.

In different exemplary embodiments, a solar cell is provided which includes a homogeneous emitter or selective emitter at its front-side (also referred to as the side facing the Sun), which is provided with a front contact which acts as a metallization network of a solar cell and which collects the electrical charging carrier (produced by the solar cell).

FIG. 1A shows a starting substrate represented, for instance—in the form of a wafer, which was processed, for instance—as usual per se, up to phosphorous diffusion. This means that the wafer includes a substrate 102.

The substrate 102 may include or consist of at least one photovoltaic coating. Alternatively, at least one photovoltaic coating may be disposed on or over the substrate 102. The photovoltaic coating may include or consist of semiconductor material (as for instance—Silicon), a composite semiconductor material (as for instance, a III-V-composite semiconductor material (as for instance, GaAs), a II-VI-composite semiconductor material (as for instance—CdTe), a I-III-V-composite semiconductor material (as for instance—copper-Indium-Disulfide)). In different exemplary embodiments, the silicon may include or consist of the so-called block moulded quasi-monocrystalline silicon (in the following, also referred to as quasi-mono silicon). In different exemplary embodiments, the photovoltaic coating may include or consist of a semiconductor transition-structure, as for instance—a p-n-transition-structure, a pin-transition structure, a Schottky-type transition-structure, and the like. The substrate 102 and/or the photovoltaic coating may be provided with a base doping of a first type of conductor.

In wafers made of quasi-mono silicon, a (for instance—linear) gradient of the dopant-concentration occurs, if these are sawn vertically, i.e. parallel to the crystallization direction from a silicon block. This leads to that the specific resistance along the surface of the wafer varies. This primarily occurs in n-type wafers (i.e. in n-doped wafers) and in p-type wafers (i.e. in p-doped wafers) which are based on UMG-material (UMG: Upgraded Metallurgical-Grade) and therefore, also contain phosphorous.

In different exemplary embodiments, the substrate may be a quasi-mono silicon-substrate, which may be, for instance—n-doped or p-doped (in this case, the substrate may be based on UMG-material).

In different exemplary embodiments, the base doping in the solar cell-substrate 102 may include a dopant-concentration (for instance—a doping of the first type of conductor, for instance—a doping with Boron (B))) in a range of approximately $10^{13}$ cm$^{-3}$ to $10^{18}$ cm$^{-3}$, for instance—in a range of
approximately $10^{14}$ cm$^{-3}$ to $10^{17}$ cm$^{-3}$, for instance—in a range of approximately $10^{15}$ cm$^{-3}$ to $2*10^{16}$ cm$^{-3}$.

The solar cell-substrate 102 may be manufactured from a solar cell-wafer and may include, for instance—a round shape, as for instance—a circular shape or an elliptical shape or a polygonal shape as for instance—a square shape. In different exemplary embodiments, the solar cells of the solar module however may also include a non-square shape. In these cases, the solar cells of the solar module may be formed, for instance—by separating (for instance—cutting) and thereby parts of one or more (in their shape, also referred to as standard solar cell) solar cell(s) into several non-square or square solar cells. In different exemplary embodiments, it may be provided in these cases, to carry out adaptations of the contact structures in the standard solar cell, for instance—rear-side transverse structures may additionally be provided.

In different exemplary embodiments, the manufactured solar cells include the following dimensions: the width in a range of approximately 5 cm to approximately 50 cm, the length in a range of approximately 5 cm to approximately 50 cm, and the thickness in a range of approximately 100 μm to approximately 300 μm.

In different exemplary embodiments, as has been described above, the base region 104 may be formed in the photovoltaic coating, for instance—doped with dopant of a first doping type (also referred to as first type of conductor), for instance—with dopant of the p-doping type, for instance—with dopant of the III$^{rd}$ main group of the periodic system, for instance—with Boron (B) or Gallium (Ga).

Further, in different exemplary embodiments, an emitter region 106 may be formed, doped with dopant of a second doping type (also referred to as second type of conductor), wherein the second doping type is opposite to the first doping type, for instance—with dopant of the n-doping type, for instance—with dopant of the V$^{th}$ main group of the periodic system, for instance—with phosphorous (P).

Alternatively, the base region may be doped with dopant of the second doping type, for instance—with dopant of the n-doping type, for instance—with dopant of the V$^{th}$ main group of the periodic system, for instance—with Phosphorous (P). In this case, the emitter region 106 may be doped with dopant of the first doping type, for instance—with dopant of the p-doping type, for instance—with dopant of the III$^{rd}$ main group of the periodic system, for instance—with Boron (B).

Furthermore, in different exemplary embodiments, a first emitter region 108 in the emitter region 106 may optionally be formed with relatively lower dopant-concentration of the dopant of the second doping type and a second emitter region 110 in the first emitter region 108 with relatively increased dopant-concentration of the dopant of the second doping type with respect to the dopant-concentration of the dopant of the second doping type. As will be described in more details in the following, the regions of the selective emitter are formed from the second emitter region. The emitter region 106 forms, for instance—a p-n-transition with the base region 104. In different exemplary embodiments, the second emitter region 110 is disposed in physical contact with the contact fingers 112.

In different exemplary embodiments, optionally an anti-reflection coating (for instance—including or consisting of silicon nitride) may be introduced on the exposed upper surface of the emitter region 106.

In different exemplary embodiments, the regions with increased dopant-concentration may be doped with a suitable dopant, as for instance—Phosphorous. In different exemplary embodiments, the second type of conductor may be a p-type of conductor and the first type of conductor may be an n-type of conductor. Alternatively, in different exemplary embodiments, the second type of conductor may be an n-type of conductor and the first type of conductor may be a p-type of conductor.

In different exemplary embodiments, the regions with increased dopant-concentration (i.e. for instance—the second emitter region 110) may be highly doped with dopant for doping with the second type of conductor with a surface doping-concentration in a range of approximately $10^{18}$ cm$^{-3}$ to approximately $10^{22}$ cm$^{-3}$, for instance—with a doping-concentration in a range of approximately $10^{19}$ cm$^{-3}$ to approximately $10^{22}$ cm$^{-3}$, for instance—with a doping-concentration in a range of approximately $10^{20}$ cm$^{-3}$ to approximately $2*10^{21}$ cm$^{-3}$. The coating resistance in the highly doped regions with the second type of conductor is in the range of approximately 10 Ohm/sq to approximately 80 Ohm/sq, for instance—in a range of approximately 30 Ohm/sq to approximately 60 Ohm/sq, for instance—in a range of approximately 35 Ohm/sq to approximately 50 Ohm/sq.

Further, in different exemplary embodiments, the other emitter region, i.e. for instance—the first emitter region 108 with the second type of conductor are lowly doped with dopant for doping with the second type of conductor with a surface dopant-concentration in a range of approximately $10^{18}$ cm$^{-3}$ to approximately $2*10^{21}$ cm$^{-3}$, for instance—with a doping-concentration in a range of approximately $10^{19}$ cm$^{-3}$ to approximately $10^{21}$ cm$^{-3}$, for instance—with a doping-concentration in a range of approximately $5*10^{19}$ cm$^{-3}$ to approximately $5*10^{20}$ cm$^{-3}$. The coating resistance in the lowly doped regions, i.e. for instance—the first emitter region 108 is in a range of approximately 60 Ohm/sq to approximately 300 Ohm/sq, for instance—in a range of approximately 70 Ohm/sq/sq to approximately 200 Ohm/sq, for instance—in a range of approximately 80 Ohm/sq to approximately 150 Ohm/sq.

In this manner, it is clear, as will be explained in more details in the following, a selective emitter is formed at least on the front-side of the photovoltaic coating.

After the doping of the emitter region 104, e.g. by a gas-phase diffusion, the phosphorus silicate glass in the case of a phosphorous diffusion may be removed by means of a PSG-etching in, for instance—a 2.5% to 25% HF-solution.

After carrying out doping in different exemplary embodiments, a most ohmic semiconductor/metal-contact is produced on the emitter 106, i.e. for instance—at the upper exposed surface of the second emitter region 110, for instance—a silicon/metal contact.

In different exemplary embodiments, this may take place in the shape of a contact grid (generally a metallization structure, for instance—in the shape of a metallization grid), which is formed by means of a printing process (for instance—by means of a screen printing process) or for instance—by means of a physical vapor deposition from the gas-phase, for instance—by means of sputtering. The contact grid may include a plurality of separate metallic regions, for instance—a plurality of contact lines or contact points, for instance—a plurality of contact fingers 112. The contact finger/s 112 may be disposed, for instance—at a distance with respect to each other and parallel to each other.

Thus, it is clear in different exemplary embodiments, a metallization structure 112 is formed on a highly doped region (for instance—the second emitter region 110) of a solar cell 100a. In different exemplary embodiments, the metallization structure 112 (also referred to as contact structure 112) may be evaporated or sputtered, for instance—by using a shadow mask. Optionally, in different exemplary embodiments, the introduced metallization structure 112 may be subsequently reinforced, for instance—electro-chemically.

Optionally, in different exemplary embodiments, a contact silicide (not represented) may be formed under the metallization structure 112.

In different exemplary embodiments, the solar cell 100a is configured as the so-called PERC (PERC: passivated emitter and rear-side solar cell; German: Solarzelle mit passiviertem Emitter and passivierter Rückseite Solarzelle) with quasi-mono substrate, for instance—quasi-mono silicon. This means that at the rear-side of the substrate 102, thus for instance—at the exposed lower surface of the base region 104, a passivation layer-structure (also referred to as rear-side passivation in the following) 114 is provided, which is locally opened. The passivation layer-structure 114 may include one or more dielectric layers, for instance—one or more oxide layers and/or one or more nitride layers. Thus the passivation layer-structure 114 may include a first passivation layer, for instance made of a thermic silicon oxide (which may be in physical contact with the substrate) or made of silicon nitride or made of Aluminium oxide, and a second passivation layer made of another material, for instance—made of silicon nitride introduced on the first passivation layer.

Figure 1B:
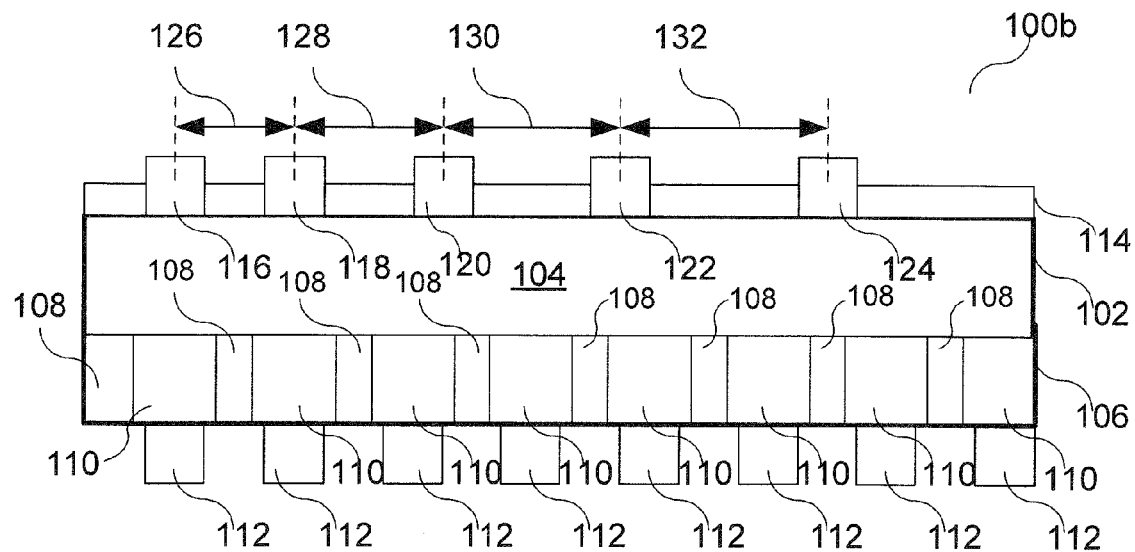
FIG. 1B shows a cross-sectional view of a solar cell according to different exemplary embodiments.

FIG. 1B alternatively shows a cross-sectional view of a solar cell 100b with a rear-side emitter according to different exemplary embodiments.

The solar cell 100b may include a homogenous rear-side emitter or a selective rear-side emitter.

In different exemplary embodiments, a solar cell is provided which includes a homogeneous emitter or one or more selective emitter on its rear-side (also referred to as shadow-side, opposite to the side facing the Sun), which is provided with a rear contact (emitter rear-side contact), which acts as a metallization network of a solar cell and collects the electrical charging carrier (produced by the solar cell).

FIG. 1B shows a starting-substrate represented, for instance—in the shape of a wafer, which was processed, for instance—as usual per se, up to Phosphorous diffusion. This means that the wafer includes a substrate 102, as described previously.

In different exemplary embodiments, as has been described above, a base region 104 may be formed in the photovoltaic coating, for instance—doped with dopant of a first doping type (also referred to as first type of conductor), for instance—with dopant of the p-doping type, for instance—with dopant of the III$^{rd}$ main group of the periodic system, for instance—with Boron (B) or Gallium (Ga).

Further, in different exemplary embodiments, an emitter region 106 may be formed, doped with dopant of a second doping type (also referred to as second type of conductor), wherein the second doping type is opposite to the first doping type, for instance—with dopant of the n-doping type, for instance with dopant of the V$^{th}$ main group of the periodic system, for instance—with Phosphorous (P).

Alternatively, the base region may be doped with dopant of the second doping type, for instance—with dopant of the n-doping type, for instance—with dopant of the V$^{th}$ main group of the periodic system, for instance—with Phosphorous (P). In this case, the emitter region 106 may be doped with dopant of the first doping type, for instance—with dopant of the p-doping type, for instance—with dopant of the III$^{rd}$ main group of the periodic system, for instance—with Boron (B).

Furthermore, in different exemplary embodiments, optionally in the emitter region 106, a first emitter region 108 may be formed with relatively lower dopant-concentration of the dopant of the second doping type and a second emitter region 110 with increased dopant-concentration of the dopant of the second doping type, relative to the dopant-concentration of the dopant of the second doping type in the first emitter region 108. As will be explained in still more details in the following, the regions of the selective emitter are formed from the second emitter region. The emitter region 106 forms with the base region 104, for instance—a p-n-junction. In different exemplary embodiments, the second emitter region 110 is disposed in physical with the contact fingers 112.

In different exemplary embodiments, optionally an anti-reflection coating (for instance—including or consisting of silicon nitride) may be introduced on the exposed upper surface of the substrate 102 (on the exposed upper surface of the base 104).

In different exemplary embodiments, the regions with increased dopant-concentration are doped with a suitable dopant, as for instance—Phosphorous. In different exemplary embodiments, the second type of conductor may be a p-type conductor and the first type of conductor may be an n-type conductor. Alternatively, in different exemplary embodiments, the second type of conductor may be an n-type conductor and the first type of conductor may be a p-type conductor.

In different exemplary embodiments, the regions with increased dopant-concentration (i.e. for instance—the second emitter region 110) may be highly doped with dopant for doping with the second type of conductor with a surface doping-concentration in a range of approximately $10^{78}$ cm$^{-3}$ to approximately $10^{22}$ cm$^{-3}$, as described previously with reference to FIG. 1A. The coating resistance in the highly doped regions with the second type of conductor is in the range of approximately 10 Ohm/sq to approximately 80 Ohm/sq, as previously described with reference to FIG. 1A.

Further, in different exemplary embodiments of the other emitter region, i.e. for instance—the first emitter region 108, may be lowly doped with the second type of conductor, with dopant for doping with the second type of conductor with a surface dopant-concentration in a range of approximately $10^{18}$ cm$^{-3}$ to approximately $2*10^{21}$ cm$^{-3}$, as previously described with reference to FIG. 1A. The coating resistance in the lowly doped regions, i.e. for instance—the first emitter region 108, is in a range of approximately 60 Ohm/sq to approximately 300 Ohm/sq, as previously described with reference to FIG. 1A.

In this manner, it is clear, as will be explained in still more details in the following, a selective emitter is formed at least at the rear-side of the photovoltaic coating.

After the doping of the emitter region 106 by e.g. gas-phase diffusion, the Phosphorous silicate glass may be removed in, for instance—a 2.5% to 25% HF-solution by means of a PSG-etching, in the case of a Phosphorous diffusion.

After carrying out doping in different exemplary embodiments, a highest possible ohmic semiconductor/metal contact, for instance—a silicon/metal contact may be produced on the emitter 106, i.e. for instance—on the upper exposed surface of the second emitter region 110, e.g. at the rear-side of the solar cell 100b.

This may take place in different exemplary embodiments in the shape of a contact grid (generally a metallization-structure, for instance—in the shape of a metallization grid), which is formed by means of a printing process (for instance—by means of a screen printing process) or for instance—by means of a physical vapor deposition process from the gas phase, for instance—by means of sputtering. The contact grid may include a plurality of separate metallic regions, for instance—a plurality of contact lines or contact points, for instance—a plurality of contact fingers 112. The contact fingers 112 may be or are disposed, for instance—at a distance with respect to each other and parallel to each other.

Thus, it is clear in different exemplary embodiments, a metallization structure 112 is formed on a highly doped region (for instance—the second emitter region 110) of a solar cell 100b. In different exemplary embodiments, the metallization structure 112 (also referred to as contact structure 112) may be evaporated or sputtered, for instance—by using a shadow mask. Optionally in different exemplary embodiments, the introduced metallization structure 112 may be subsequently reinforced, for instance—electro-chemically.

Optionally in different exemplary embodiments, a contact silicide (not represented) may be formed above the metallization structure 112.

In different exemplary embodiments, the solar cell 100b, as represented in FIG. 1B, includes a passivated emitter and a passivated front-side, wherein the solar cell has or will be formed by means of a quasi-monocrystalline substrate, for instance—by means of quasi-monocrystalline silicon. This means that a passivation layer-structure (also referred to as front-side passivation in the following) 114 is provided on the front-side of the substrate 102, thus for instance—on the exposed upper surface of the base region 104, which is locally opened. The passivation layer-structure 114 may include one or more dielectric layers, for instance—one or more oxide layers and/or one or more nitride layers. Therefore, the passivation layer-structure 114 may include a first passivation coating, for instance—made of a thermic silicon oxide (which may be in physical contact with the substrate) or made of silicon nitride or made of Aluminium oxide, and a second passivation coating made of another material introduced on the first passivation coating, for instance—made of silicon nitride.

It goes without saying that the passivation 114 on the front-side, the incident light side, the solar cell is permeable for the corresponding incident electromagnetic radiation (the light).

According to different embodiments, the solar cell 100b may include an increased yield or efficiency, because the adjusted distance of the contacts on the front-side of the solar cell facilitates the amount of incident light into the base 104. In other words, an optimal distance of the front-side contacts may increase the efficiency of the solar cell 100b taking into account of the series resistance losses.

Further, a dielectric passivation may be fitted between the contacts 112 (the contact fingers 112).

Further, the front-side contacts 126, 128, 130, 132, as represented in FIG. 1B, may be fitted as contact fingers, for instance—with variable distance (e.g. Pitch).

According to different exemplary embodiments, the solar cell 100b represented in FIG. 1B, may be an n-type solar cell made of quasi-monocrystalline silicon with variable front-side finger distance. Further, the solar cell 100b may be similar to a PERC-solar cell, however wherein the emitter has or will be formed on the rear-side of the cell.

Thereby, the distance of contact fingers may be adjusted to the resistance of the substrate, in order to minimize electrical losses due to too high a series resistance. Since, in conventionally manufactured silicon wafers and/or solar cells, the resistance may be largely constant over the wafer surface, a fixed distance of the contact finger may be selected in the conventional solar cells.

As described previously, the distance of the contacts and/or contact fingers 126, 128, 130, 132, which directly contact the wafer, is optimal at a fixed distance between the contacts only on certain parts of the surface, on other parts, a loss may occur due to too high a series resistance) at too large finger distance) or too high an optical shadowing (at too small finger distance).

According to different exemplary embodiments, the solar cell 100b may include a distance of the contact finger varying over the wafer surface on the cell front-side. Optionally, the finger height (the height of the contacts) may be or is varied along the wafer surface. Thereby, a large finger height may be fitted or selected in the regions with larger finger distance and a small height in the regions with small finger distance. Thereby, for instance—it may be compensated that the electrical current in the contact fingers includes a higher current density in the regions with larger finger distance than in the contact fingers in the regions with smaller finger distance. In other words, the finger height may be or is adjusted in the contacts to the local current density or the current flow.

According to different exemplary embodiments, the front-side of the solar cell 100b may be dielectrically passivated, for instance—without a so-called Front-Surface-Field (Front-side field).

Figure 2:
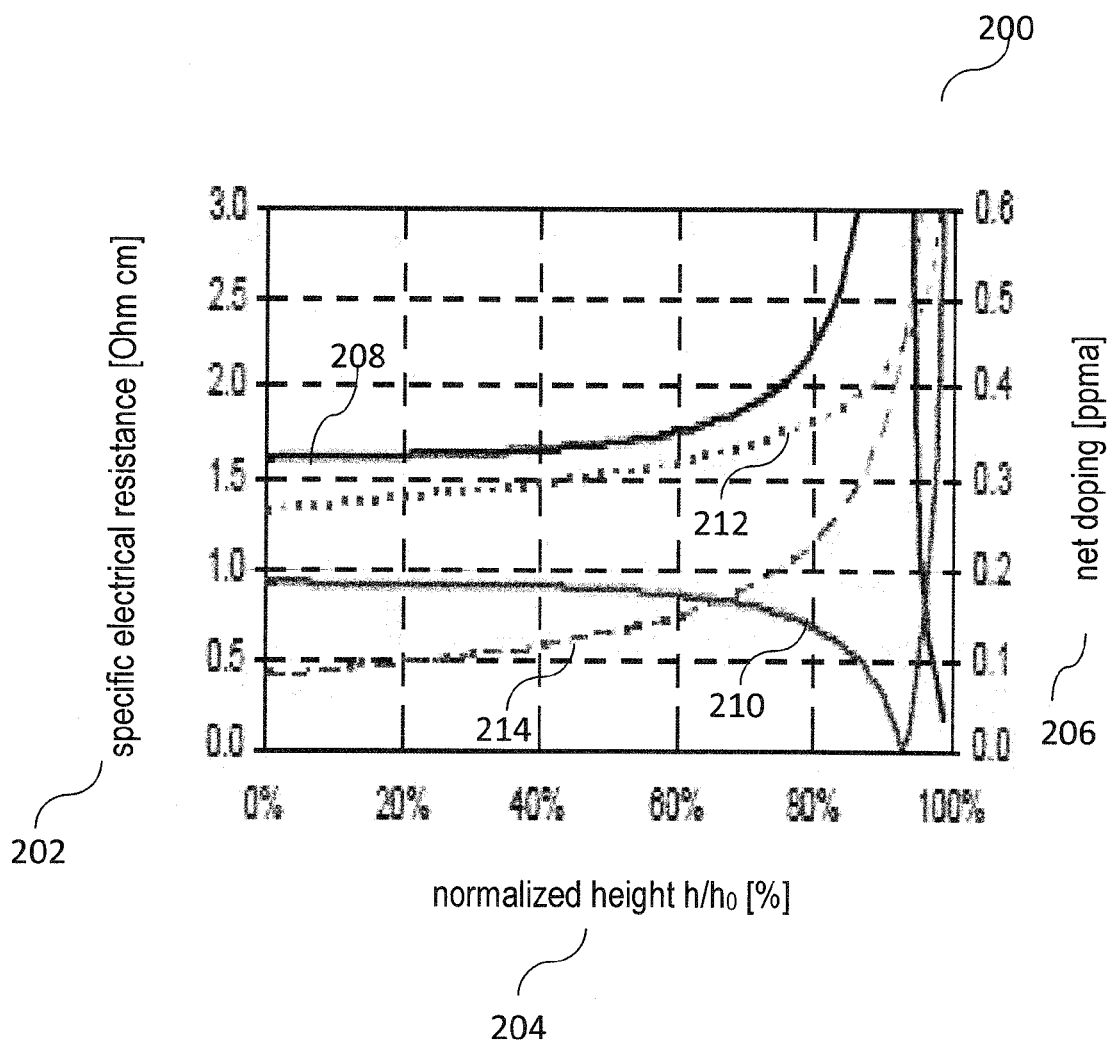
FIG. 2 shows a diagram, in which the specific electrical resistance dependent on the location within the substrate is represented.

FIG. 2 shows a diagram 200, in which the net doping and the specific electrical resistance 202 is represented against the ingot height in an ingot, which was manufactured by means of compensation of the dopant without re-dosing during the crystallization phase. If wafer is sawn from this ingot in the crystallization direction, then the same curve of the specific electric resistance 202 appears, emanating from a lateral surface 104 of the substrate 102 depending on the place on the substrate 102. FIG. 2 shows the diagram 200 for a nominal p-type silicon block made of phosphorous material without re-dosing of the dopant.

The curve of the specific resistance 202 and the dopant-concentration 206 are shown in FIG. 2 for a block mc Si with dopant-compensation. By the poor integration of the dopant (for instance—Phosphorous (P)) in the solidified silicon of the substrate 102, the relative dopant-concentration (for instance—P-concentration) rises to the crystal surface (height 100%) and the resistance increases. In vertical sawing of wafers for forming the substrate 102 from the region 50-90% of the height, as represented, the specific electrical material resistance on each wafer would be varied, for instance—between 1.5 Ohm-cm and 3 Ohm-cm.

In the diagram 200, the following characteristic curves are represented:
- a first characteristic curve 208, which represents the curve of the specific electrical resistance;
- a second characteristic curve 210, which represents the curve of the net doping (also referred to as base doping);
- a third characteristic curve 212, which represents the curve of a p-dopant-concentration (for instance—Boron (B)); and
- a fourth characteristic curve 214, which represents the curve of an n-dopant-concentration (for instance—Phosphorous (P)).

Figure 3:
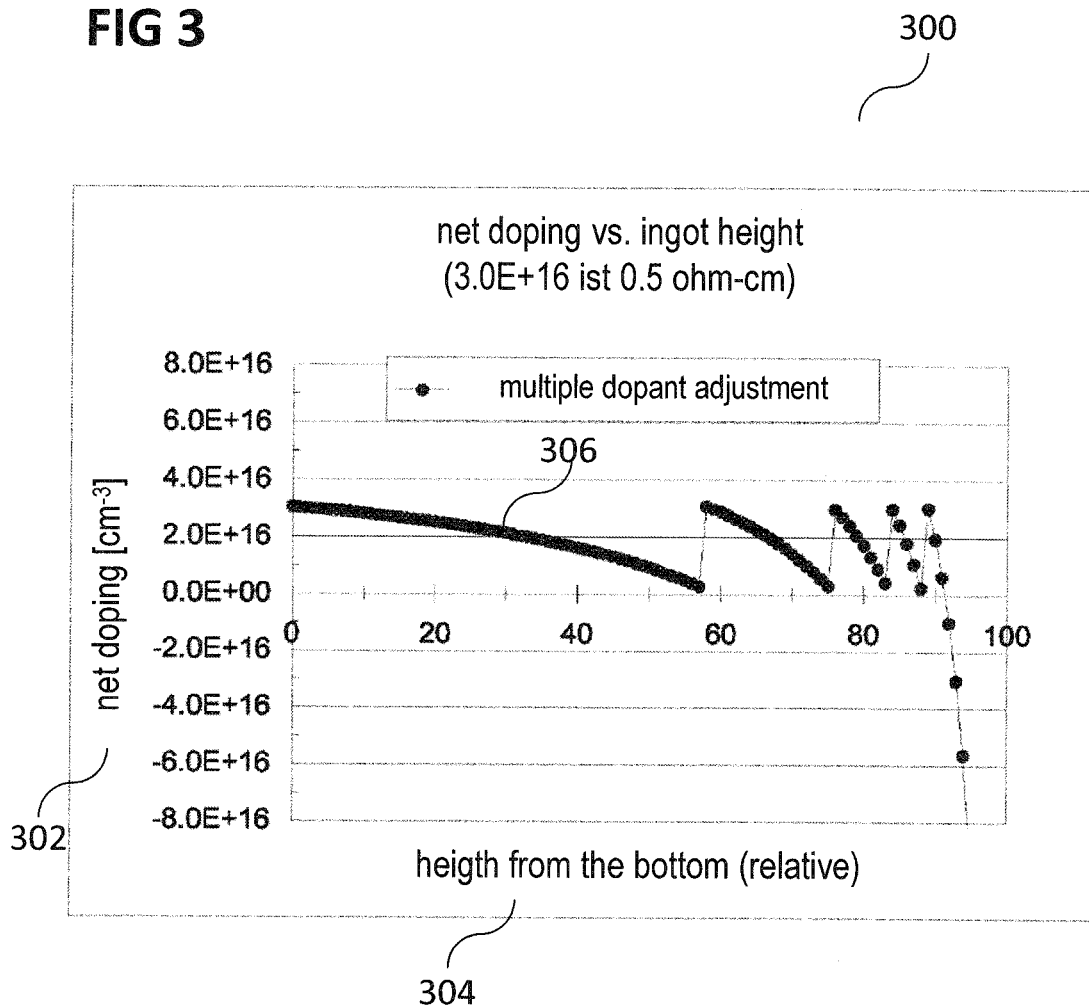
FIG. 3 shows a diagram, in which the net doping is represented against the ingot height, in an ingot, which was manufactured by means of the re-dosing of the dopant during the crystallization phase.

FIG. 3 shows a second diagram 300, in which in a characteristic curve 306, the net doping 302 is represented against the ingot height 304 in an ingot, which is was manufactured by means of re-dosing of the dopant during the crystallization phase.

In this example of a p-doted and n-doted block, during the crystallization, p-dopant was supplied in batches, in order to compensate the fall of the net dopant-concentration, i.e. the increase of the specific resistance. However, the resistance over the block height varies between 0.5 and approximately 2.5 Ohm-cm (see characteristic curve 306). During vertical sawing of wafers in crystallization direction, these variations occur over the wafer, in other words, along the wafer rear-side surface.

The enrichment of, for instance—Phosphorous (P) in the melt appears in the curve of the crystallization, particularly in n-type blocks.

A varying resistance curve may also appear in conventionally sawn wafers, if the phase limiting surface during the crystallization does not extend horizontally. A convex phase limiting shape as well as a concave phase limiting shape leads to a base resistance gradient over the wafer surface.

Thus, the exemplary embodiments are not limited to a quasi-mono-solar cell, but may be used on any solar cell-substrate, in which a gradient of the electrical conductivity of the substrate is present along the lower surface of the base region 104. For instance, the substrate may include a {100}-crystal orientation.

Thus, in different exemplary embodiments, several regions therefore include different conductivities, for instance—a first region and a second region, wherein the first region includes at least a first electrical conductivity and the second region includes at least a second electrical conductivity which is greater than the first electrical conductivity.

On the other hand, referring to FIG. 1A and FIG. 1B, in the solar cell 100a, 100b, a plurality of through openings (also referred to as through holes) are formed through the passivation layer structure 114 and the through openings are filled with an electrically conductive material, for instance—a metal containing material, for instance—a Silver and/or Aluminium containing material. Therefore, for instance—the through openings may be filled with a silver and/or Aluminium containing screen printing paste and hardened. Thus, local contacts (front-side contacts and/or rear-side contacts) 116, 118, 120, 122, 124 are formed, which may be electrically insulated from each other respectively, for instance—by means of the passivation layer-structure 114. Optionally, the local contacts (front-side contacts and/or rear-side contacts) 116, 118, 120, 122, 124 may be electrically connected to each other by a metallic layer or metallic structure (a structured metallic layer) on the passivation layer 114. The contacts (front-side contacts and/or rear-side contacts) together clearly form a contact structure on the surface (front-side and/or rear-side) of the substrate 102. The contacts in a respective opening of the passivation are provided in such a manner that the respective contact 116, 118, 120, 122, 124 electrically contact the surface of the substrate 102.

The through opening or through holes and thereby even the contacts (front-side contacts and/or rear-side contacts) 116, 118, 120, 122, 124 may basically include any shape, for instance—may be configured at least partially linear and/or at least partially point shaped. The linear contacts 116, 118, 120, 122, 124 may be disposed rectilinear or arcuate. Furthermore, the linear rear-side contacts 116, 118, 120, 122, 124 may be disposed parallel or radial.

The contacts (front-side contacts and/or rear-side contacts) 116, 118, 120, 122, 124 are respectively disposed at a distance with respect to each other. Therefore, for instance—a first contact 116 and a second contact 118 may be disposed at a first distance 126 (for instance—at a distance (for instance—Pitch) of approximately 50 µm) with respect to each other. Further, for instance—the second contact 118 and a third contact 120 may be disposed at a second distance 128 (for instance—at a distance (for instance—Pitch) of approximately 500 µm) with respect to each other. Further, for instance—the third contact 120 and a fourth contact 122 may be disposed at a distance 130 (for instance—at a distance (for instance—Pitch) of approximately 1 mm) with respect to each other. Finally, for instance—the fourth contact 122 and a fifth contact 124 may be disposed at a distance 132 (for instance—at a distance (for instance—Pitch) of approximately 5 mm) with respect to each other.

Generally, the respective distances between two respective (for instance—adjacent) contacts may be selected in a range of, for instance—approximately 50 µm (in a region of a lower electrical conductivity of the base region) to approximately 5 mm (in a region of a high electrical conductivity of the base region), for instance in a range of approximately 50 µm to approximately 3 mm, for instance in a range of approximately 100 µm to approximately 2 mm, for instance—in a range of approximately 300 µm to approximately 2 mm. The contacts may include (for instance—if they are configured linear) a Linear width in a range of approximately 10 µm to approximately 200 µm, for instance—in a range of approximately 30 µm to approximately 100 µm, for instance—in a range of approximately 50 µm to approximately 70 µm.

Generally, the contact-structure (front-side contact-structure and/or rear-side contact-structure) thus include a plurality of contacts 116, 118, 120, 122, 124, wherein (at least) two contacts (for instance—first contact 116 and second contact 118) are disposed at a distance (for instance—the first distance 126) with respect to each other in the first region, and wherein two further contacts (for instance—third contact 120 and fourth contact 122) are disposed at another distance (for instance—the third distance 130) with respect to each other in the second region. The other distance between the further contacts of the second region is greater than the distance between the contacts of the first region.

The substrate 102 may generally include any number of regions of different electrical conductivities and the distances of the contacts (front-side contacts and/or rear-side contacts) may be or is selected dependent on the respective electrical conductivity. Therefore, the substrate 102 may include, for instance—a third region, wherein the third region includes at least one third electrical conductivity, which is greater than the second electrical conductivity, and there may still be two further contacts disposed at a third distance with respect to each other in the third region. The third distance may be greater than the second distance.

Thus, in different exemplary embodiments, the solar cell may be configured as PERC-solar cell 100a, or modified as solar cell 100b with a passivated rear-side emitter and passivated front-side.

In a solar cell 100a, 100b with point shaped or stripe shaped local contacts 116, 118, 120, 122, 124 in different exemplary embodiments, the optimal distance of the contact structures (Pitch) inter alia depends on the specific electrical resistance of the wafer. At small specific electrical resistance, a greater distance between every two contacts 116, 118, 120, 122, 124 may be selected, without the lateral electrical resistance of the wafer material restricting the efficiency.

If a PERC solar cell-structure is processed on a quasi-mono wafer with (approximately) linear curve of the specific electric resistance and as in conventional manner, a fixed (i.e. always the same) pitch of the rear-side contacts is selected, there are always regions on the wafer, for which local specific resistance of the pitch is not optimal and therefore, the efficiency losses must be accepted.

It was recognized that in a solar cell, these losses on a quasi-mono wafer with (approximately) linear curve of the specific resistance, may be reduced, while at the front-side contacts and/or rear-side contacts of the solar cell, the pitch (generally the distance) of the local rear-side contacts over the wafer may be varied, so that the pitch (generally the distance) for a respective local specific material resistance is optimally adjusted. For manufacturing such a solar cell, initially the curve of the electrical resistance (or the electrical conductivity) of the wafers is measured and (for instance—by means of a model) the optimized distance (for instance—pitch) is determined as a function of the resistance or the conductivity. Then, the suitable values for the distance (for instance—pitch) are transferred in a layout for the arrangement of the local contacts. In a subsequent step, the passivation layer is opened at the rear-side corresponding to this layout by the laser and then, the contacts 116, 118, 120, 122, 124 are formed. Thus, the passivation layer 114 includes laser-ablated regions, in which the contact-structure is arranged.

Alternatively, the contact-structure may be processed after introducing a metallization layer by a laser process, for instance—by means of laser-fired contacts, by using the suitable layout for the arrangement of the contacts.

Figure 4:
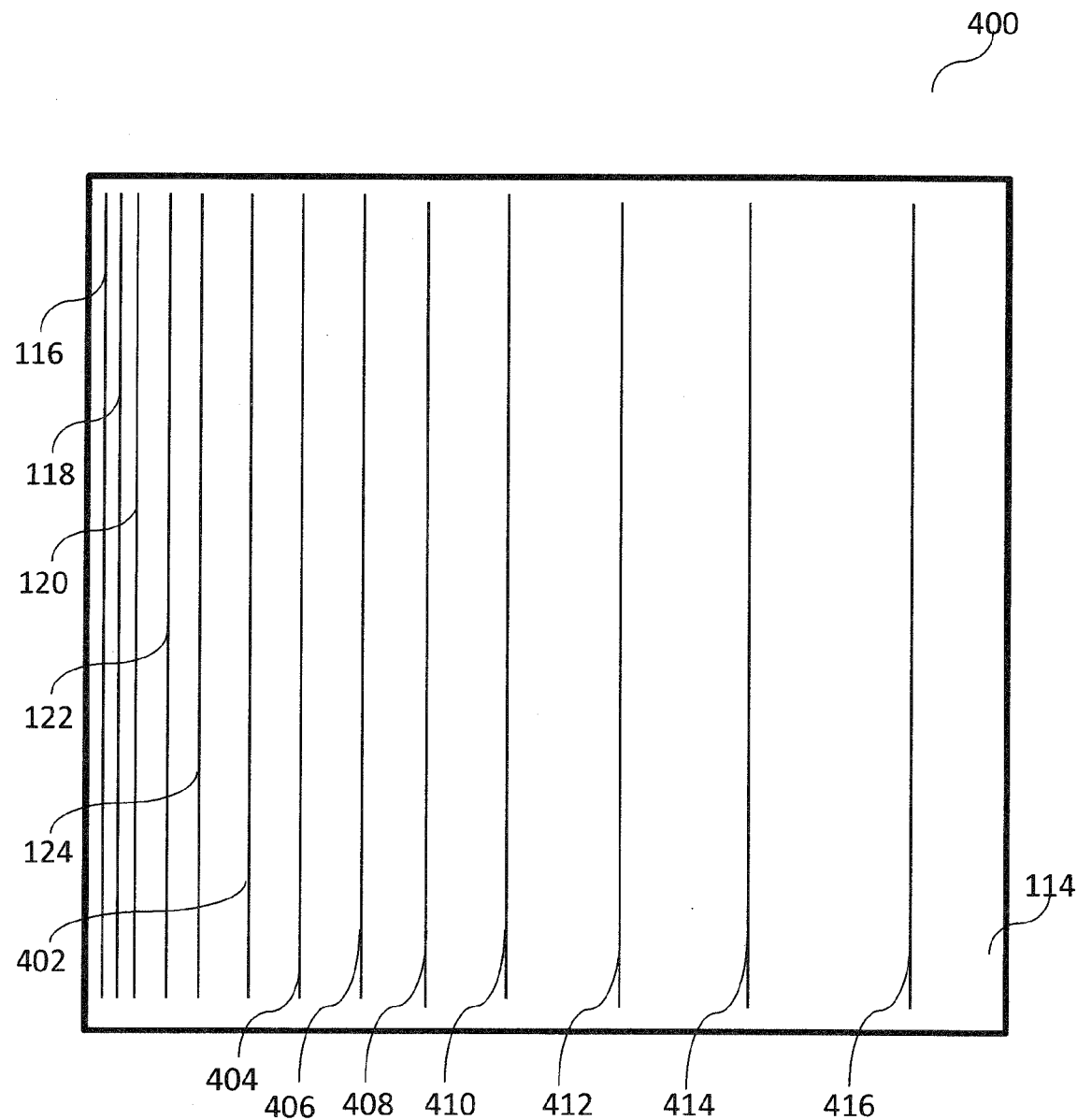
FIG. 4 shows a view from below at the rear-side on the solar cell, according to different exemplary embodiments.

FIG. 4A shows a view 400a from below at the rear-side on the solar cell 100a according to FIG. 1A as per different exemplary embodiments or also a view 400a from above at the front-side on the solar cell 100b according to FIG. 1B as per different exemplary embodiments, wherein more linear contacts 116, 118, 120, 122, 124, 402, 404, 406, 408, 410, 412, 414, 416 are represented in FIG. 4 than in FIG. 1A and FIG. 1B respectively; generally, any number of contacts 116, 118, 120, 122, 124, 402, 404, 406, 408, 410, 412, 414, 416 may be provided at the front-side and/or rear-side of a solar cell according to different exemplary embodiments.

The contacts 116, 118, 120, 122, 124, 402, 404, 406, 408, 410, 412, 414, 416 may be disposed, as represented in FIG. 4, parallel to each other, alternatively however, they may also be disposed at an angle with respect to each other. They may also be configured wavy or bent or serrated.

In case that the represented linear contacts are fitted at the front-side of the solar cell, these may further be connected to one or more so-called busbars. These busbars may be, for instance—essentially perpendicular to the represented linear contacts. These may also be transferred on the following described figures in an analogous or varied manner.

Figure 5:
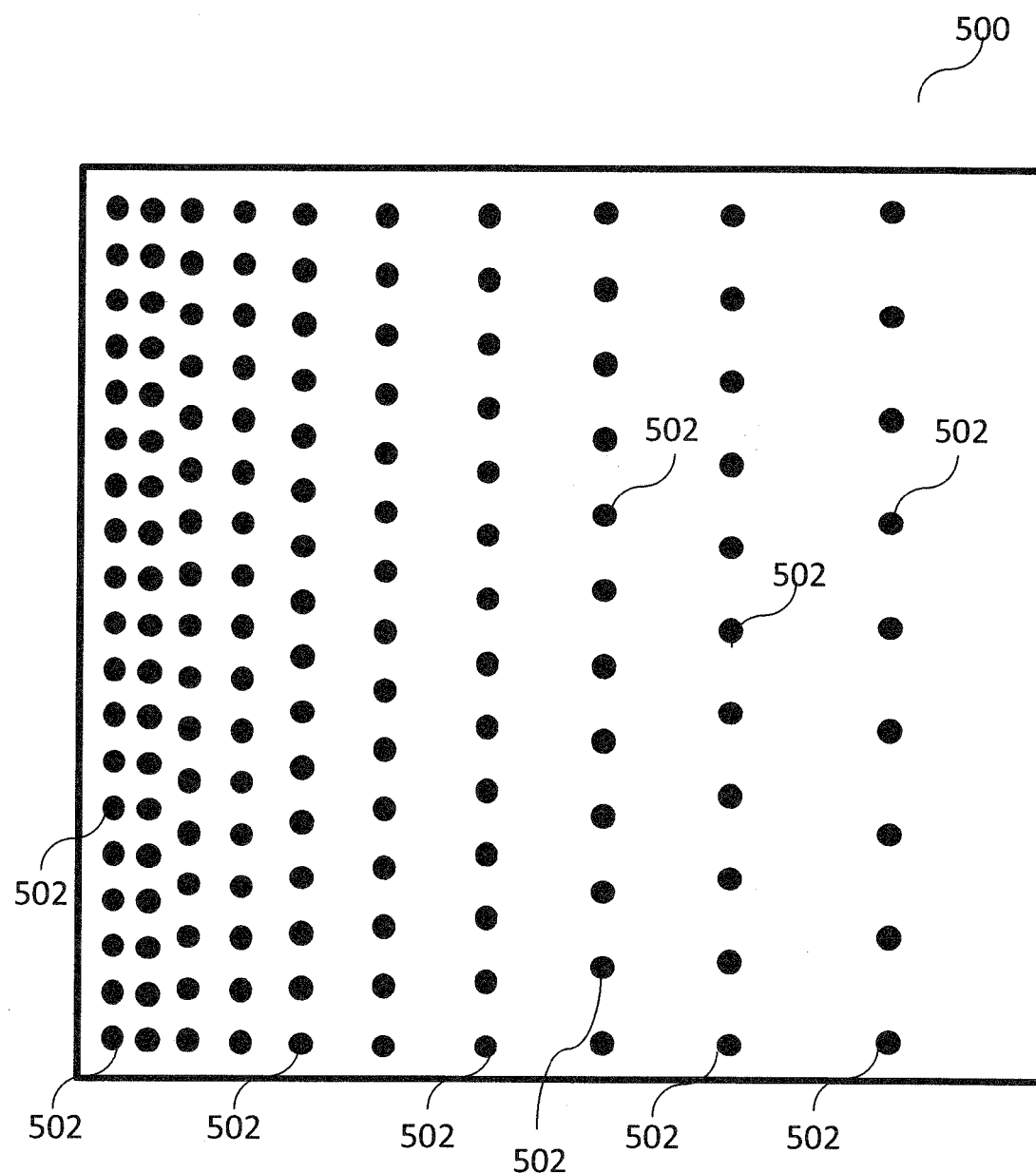
FIG. 5 shows a view from below at the rear-side on the solar cell, according to different exemplary embodiments.

FIG. 5 shows a view 500 from below at the rear-side or from above at the front-side on another solar cell according to different exemplary embodiments. Except for the shape of the contacts 502, which in this case may be configured point shaped (for instance—thus circular or elliptical or with other round or rounded-off shape), the other elements of the solar cell may be configured in the same manner, as those of the solar cell 100a, 110b according to FIG. 1A and FIG. 1B. Generally, the contacts 502 may be disposed in a regular pattern or in an irregular pattern, however wherein even in these exemplary embodiments, the distances between the contacts 502 may be varied, for instance—depending on the electrical conductivity of the substrate, for instance—of the base region of the solar cell. The point shaped contacts 502 may all be configured of the same size or partially with different sizes as well.

Figure 6:
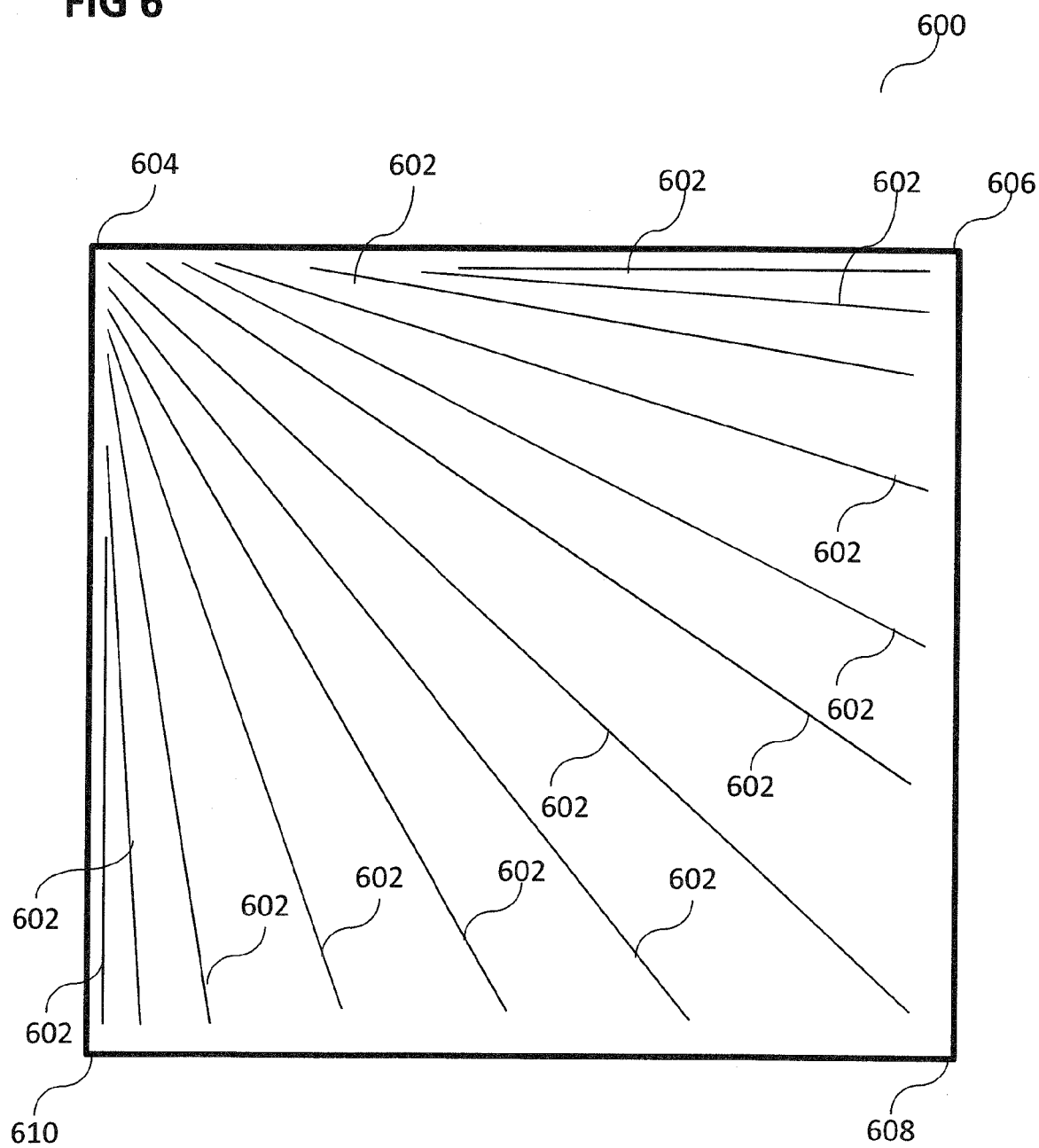
FIG. 6 shows a view from below at the rear-side on the solar cell, according to different exemplary embodiments.
Figure 7:
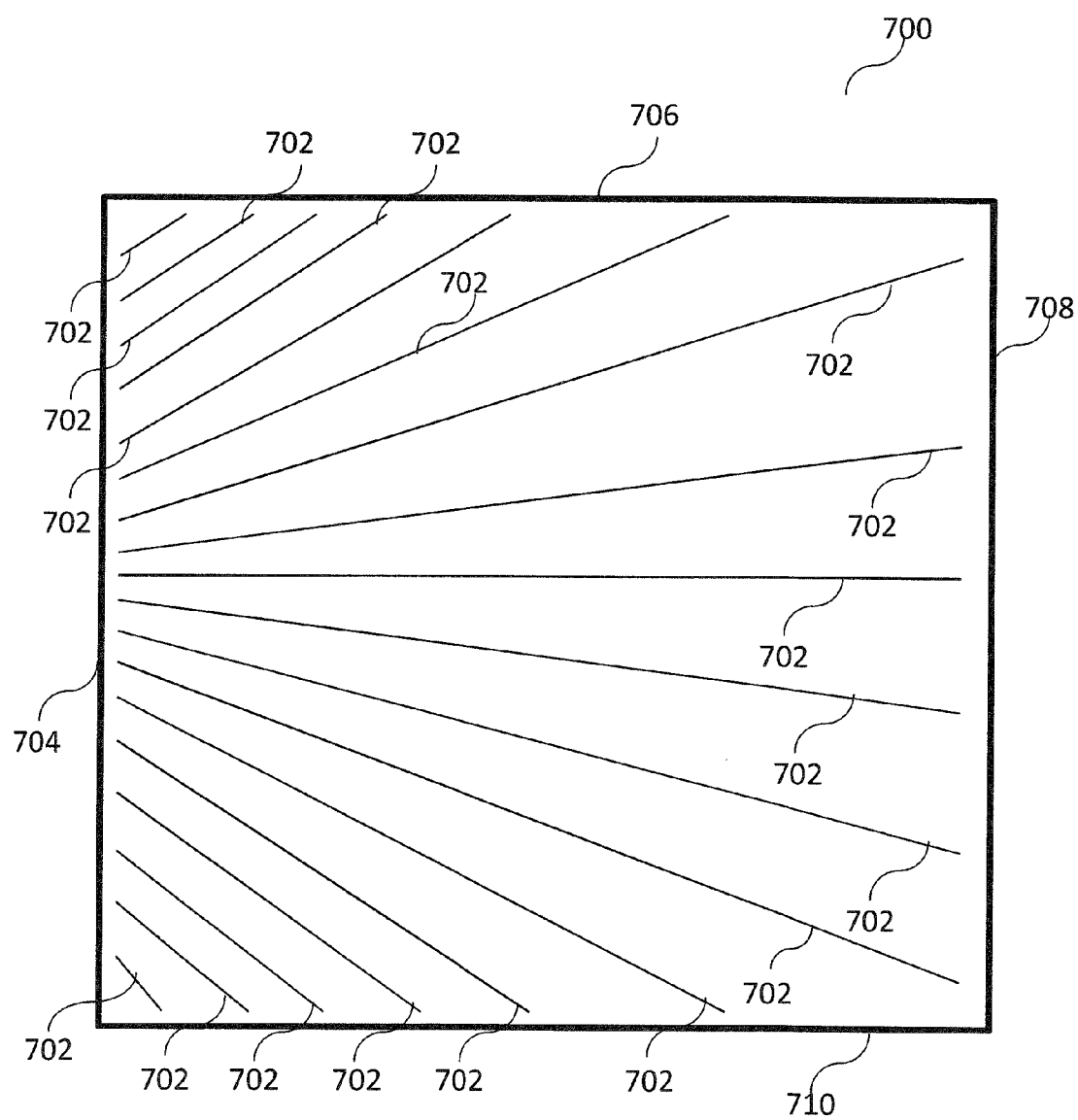
FIG. 7 shows a view from below at the rear-side on the solar cell, according to different exemplary embodiments.

FIG. 6 shows a view 600 from below at the rear-side or from above at the front-side on another solar cell according to different exemplary embodiments. Except for the arrangement of the contacts 602, which may be configured star shaped (and linear) in this case, wherein in these exemplary embodiments, the individual contacts 602 emanate from the left upper corner 604 (alternatively from any other corner 606, 608, 610 or even from the edge (for instance—the center of a side edge 704, 706, 708, 710) on a solar cell according to different exemplary embodiments, as in the contacts of the view 700 in FIG. 7), the other elements of the solar cell may be configured in the same manner, as those of the solar cell 100a, 110b according to FIG. 1A and FIG. 1B. Even in these exemplary embodiments, the distances between the contacts 602, 702 may vary, for instance—depending on the electrical conductivity of the substrate, for instance—of the base region of the solar cell.

FIG. 8 shows a view 800 from below at the rear-side or from above at the front-side on another solar cell according to different exemplary embodiments. Except for the arrangement of the contacts 802, which may be configured arcuate in this case, (and for instance—approximately concentric with respect to each other), the other elements of the solar cell may be configured in the same manner, as those of the solar cell 100a, 110b according to FIG. 1A and FIG. 1B. Even in these exemplary embodiments, the distances between the contacts 802 may vary, for instance—depending on the electrical conductivity of the substrate, for instance—of the base region of the solar cell. In this case, the centre of the arcuate (for instance—circular) contacts 802 may be provided at a side edge (for instance—the centre of a side edge 804, 806, 808, 810). It is important to note that the contacts 802 may also extend undulated.

FIG. 9 shows a view 900 from below at the rear-side or from above at the front-side on another solar cell according to different exemplary embodiments. Except for the arrangement of the contacts 902, which may be configured arcuate (and for instance—approximately concentric with respect to each other) in this case, the other elements of the solar cell may be configured in a similar manner, as those of the solar cell 100a, 100b according to FIG. 1A and FIG. 1B. Even in these exemplary embodiments, the distances between the contacts 902 may vary, for instance—depending on the electrical conductivity of the substrate, for instance—of the base region of the solar cell. In this case, the centre of the arcuate (for instance—circular) contacts 902 may be provided at a corner 904, 906, 908, 910 of the substrate. It is important to note that the contacts 902 may also extend undulated.

In the represented exemplary embodiments, it is respectively assumed without restriction of the generality that a region of lower electrical conductivity (and thereby relatively higher density (lower opposite distance) of the contact) is present to the left region of the solar cell respectively and the electrical conductivity increases in the direction towards right, for instance—monotonously (for instance—highly monotonously), and thus, the density of the contacts increases (i.e. the distance between the contacts decreases).

Figure 10A:
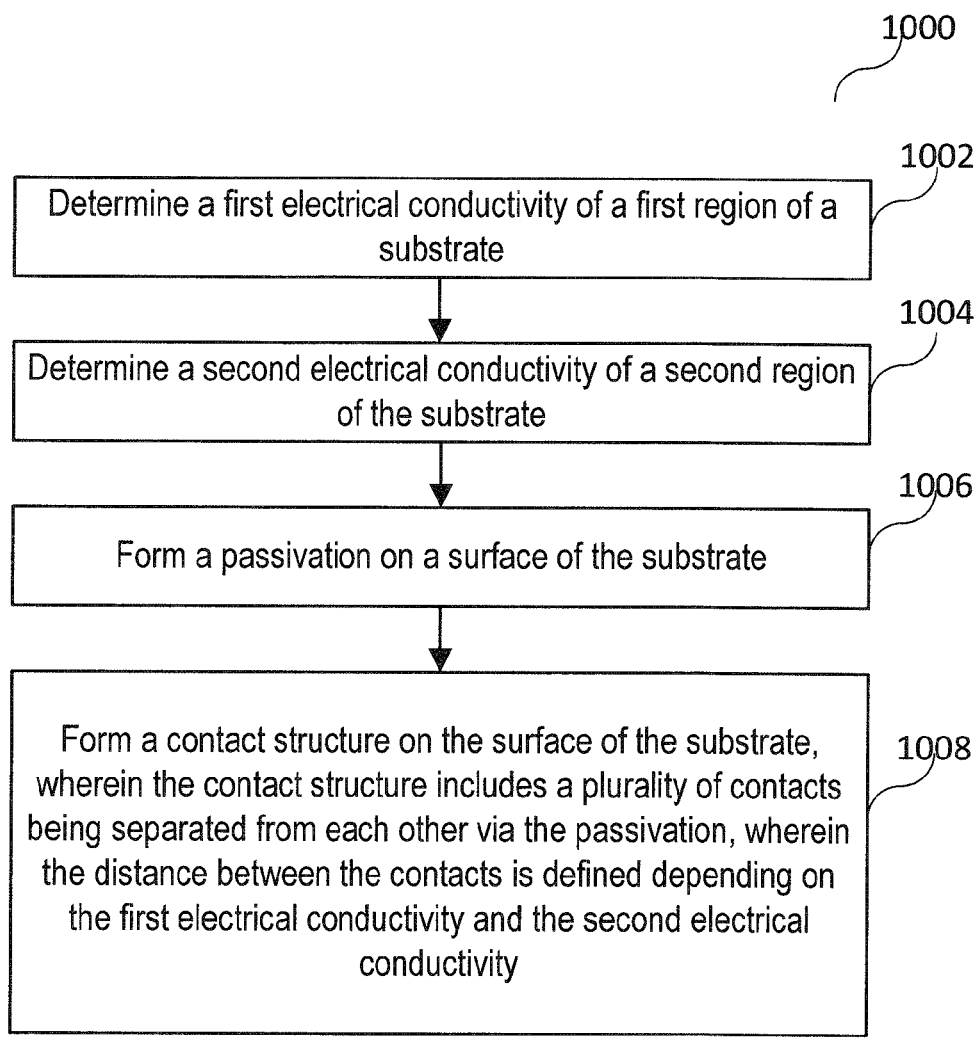
FIGS. 10A to 10C each show a flow diagram, in which a method for manufacturing a solar cell according to different exemplary embodiments is represented.
Figure 10B:
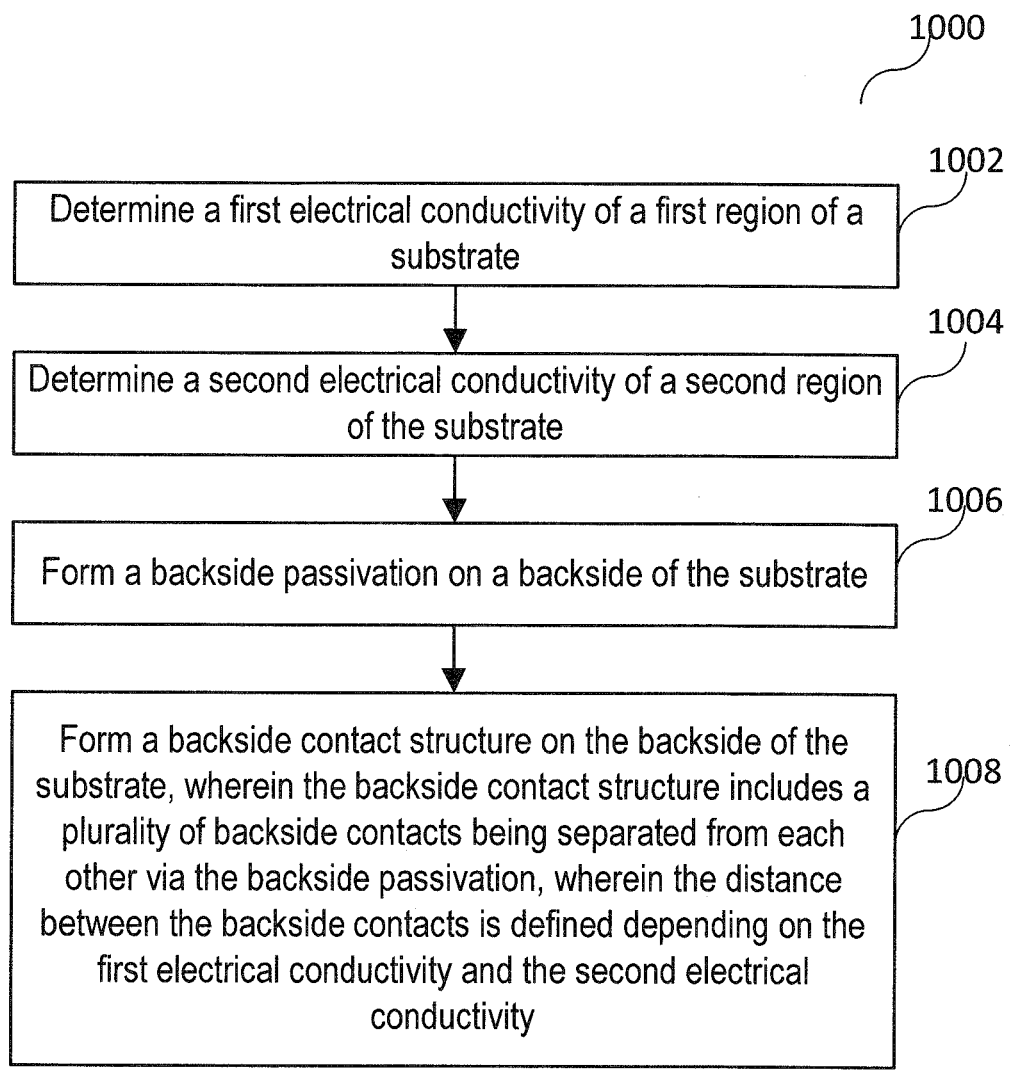
Figure 10C:
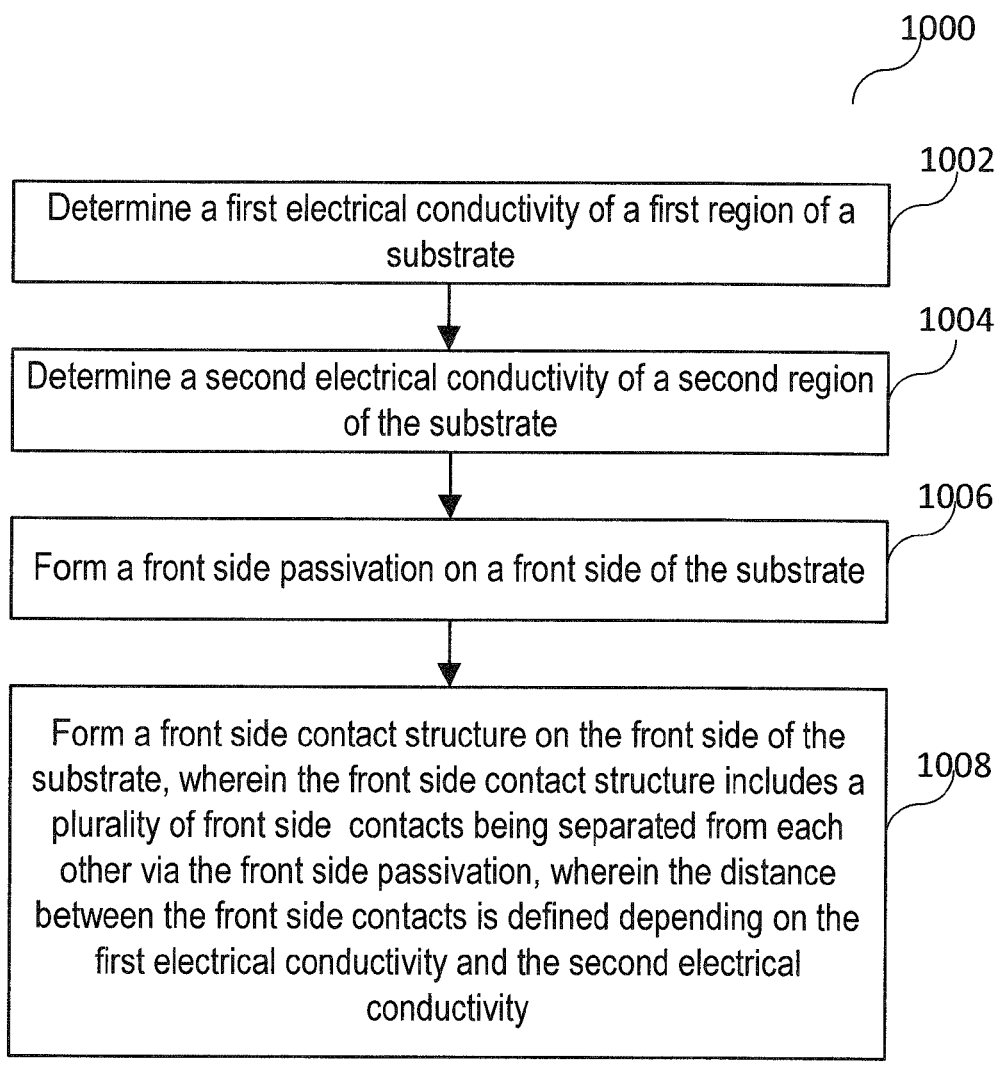

FIG. 10A, FIG. 10B and FIG. 10C each show a schematic flow diagram, in which a method for manufacturing a solar cell according to different exemplary embodiments is represented.

As illustrated in FIG. 10A, the method 1000 may include the following steps: determining in step 1002, a first electrical conductivity in a first region of a substrate, and, determining in step 1004, a second electrical conductivity in a second region of the substrate, wherein it is assumed that the second electrical conductivity is greater than the first electrical conductivity. Further, in step 1006, a passivation is formed on the surface of the substrate. Furthermore, in step 1008, a contact structure is formed on the surface of the substrate, wherein the contact structure includes a plurality of contacts, which are surrounded by regions of the passivation, wherein distances of the contacts are defined depending on the first electrical conductivity and the second electrical conductivity.

Further, as illustrated in FIG. 10B, in step 1006, a rear-side passivation may be formed at the rear-side of the substrate. Furthermore, in step 1008, a rear-side contact-structure may be formed at the rear-side of the substrate, wherein the rear-side contact-structure includes a plurality of rear-side contacts, which are surrounded by regions of the rear-side passivation, wherein distances of the rear-side contacts from each other may be defined depending on the first electrical conductivity and the second electrical conductivity.

Further, as illustrated in FIG. 10C, in step 1006, a front-side passivation may be formed at the front-side of the substrate. Furthermore, in step 1008, a front-side contact-structure may be formed at the front-side of the substrate, wherein the front-side contact-structure includes a plurality of front-side contacts, which are surrounded by the regions of the rear-side passivation, wherein the distances of the front-side contacts from each other may be defined depending on the first electrical conductivity and the second electrical conductivity.

As has been described above, the method may be used, for instance—for linear (rear-side- or front-side-) contacts. In this case, the distance of the contacting strips over the wafer may be varied. The method may be used, for instance—if the specific electrical resistance changes with a linear curve perpendicular to the contact lines.

In the case of point shaped contact-structures (e.g. LFC-contacts), each two-dimensional variation of the resistance may be compensated by the optimal pitch in both the directions.

The following table shows an example for the dependency of the optimal pitch on the electrical resistance for a PERC-solar cell with LFC-rear-side contacts:

| Resistance [Ohm-cm] | Pitch for maximum Efficiency [μm] |
|---|---|
| 0.5 | Maximum Efficiency 763 |
| 0.95 | 658 |
| 1.4 | 591 |
| 1.85 | 544 |
| 2.3 | 511 |
| 2.75 | 484 |
| 3.2 | 463 |
| 3.65 | 446 |
| 4.1 | 431 |
| 4.55 | 418 |
| 5.0 | 407 |

0.3% abs. Efficiency-loss

In this example, the efficiency was reduced to 0.3% abs., if the smallest pitch of the table (for instance—407 μm) would be used for the smallest (for instance—0.5 Ohm-cm).

In different exemplary embodiments, a solar cell is provided on a quasi-mono wafer with a curve of the specific resistance parallel to the wafer edge and linear contacts. The manufacture of the solar cell may include determining the material resistance as a function of the distance from a reference edge; computing the optimal linear distance of the contact-structure as a function of the material resistance; and firing Laser for producing linear openings of the passivation layer with a respective distance, which corresponds to the optimal pitch as a function of the distance to the reference edge.

In different exemplary embodiments, further a solar cell is provided on a quasi-mono wafer with any variation of the specific material resistance and point shaped contacts (e.g. LFC-contacts). The manufacture of the solar cell may include determining the material resistance as a function of the position on the wafer; computing the optimal pitch of the contact-structure as a function of the material resistance; building a layout of point contacts with a respective distance, which corresponds to the optimal spatially resolved pitch; and firing a Laser for producing the point structure in the passivating layer.

Clearly, in different exemplary embodiments, a solar cell with local contact-structure is provided, in which the distance (for instance—pitch) is changed depending on the position on the wafer. The solar cell may be configured on or in a quasi-mono wafer with a specific electrical resistance, which depends on the position. The specific resistance may be changed, for instance—linearly over the wafer. Further, the contact (front-side contact or rear-side contact) may consist of or include lines, the opposite side distance of which depends on the position on the wafer. The contact (also referred to as rear contact (back contact) or front contact (front contact)) may consist of or include points, the opposite side distance of which depends on the position on the wafer.

Further, in different exemplary embodiments, a method for manufacturing a solar cell is provided, in which the specific material resistance of a wafer is measured depending on the position; in which (for instance—with a simulation model) an optimized pitch is computed depending on the material resistance for the respective specific PERC-solar cell or other solar cell; in which a contact layout is built, which contains the optimized pitch depending on the spatially resolved material resistance; and by which contacts with this contact layout are manufactured.

The contact structure may consist of or include lines, the opposite side of which is varied. Furthermore, the contact structure may consist of or include points, the opposite side distance of which is changed.

The invention claimed is:

1. A solar cell, including;
a substrate with a first region and a second region, wherein the first region includes at least a first electrical conductivity and the second region includes at least a second electrical conductivity, wherein the second electrical conductivity is greater than the first electrical conductivity, wherein the substrate includes a dopant profile, wherein the dopant profile varies monotonically from a first edge of the substrate in the first region to at least a second edge of the substrate in the second region, wherein the difference in the electrical conductivity of the first and second regions is dependent on the dopant profile;
a passivation on a surface of the substrate; and
a contact-structure on the surface of the substrate, wherein the contact-structure includes a plurality of contacts spaced apart at a plurality of distances; wherein the plurality of distances includes at least a first distance and a second distance;
wherein two contacts of the plurality of contacts are disposed at the first distance with respect to each other in the first region;
wherein two further contacts of the plurality of contacts are disposed at the second distance with respect to each other in the second region;
wherein the second distance is greater than the first distance, wherein the first distance and the second distance varies proportionally to the dopant profile, and wherein the plurality of distances increases from the first edge to the second edge;
wherein the passivation is a rear-side passivation,
wherein the surface of the substrate is a rear-side of the substrate, and
wherein the contact-structure is a rear-side contact-structure.

2. A solar cell according to claim 1, wherein the substrate includes a {100}-crystal orientation.

3. A solar cell according to claim 1,
wherein the passivation includes a plurality of openings;
wherein a respective contact is provided in a respective opening of the passivation in such a manner that the respective contact electrically contacts the surface of the substrate.

4. A solar cell according to claim 1, wherein the contacts are configured at least partially linear and/or at least partially point shaped.

5. A solar cell according to claim 1, wherein the contact-structure includes Laser-fired contacts.

6. A solar cell according to claim 1, wherein the passivation includes Laser-ablated regions, in which the contact-structure is disposed.

7. A solar cell according to claim 1,
wherein the substrate includes a third region, wherein the third region includes at least a third electrical conductivity, which is greater than the second electrical conductivity;
wherein the plurality of distances includes a third distance;

wherein two further contacts are disposed at the third distance with respect to each other in the third region; and wherein the third distance is greater than the second distance.

8. A solar cell according to claim 1, further including: an emitter structure on the front-side of the substrate, which forms a p-n-j unction with the substrate.

9. A method for manufacturing a solar cell, the method including;
determining a first electrical conductivity in a first region of a substrate;
determining a second electrical conductivity in a second region of the substrate, wherein the second electrical conductivity is greater than the first electrical conductivity, wherein the substrate includes a dopant profile, wherein the dopant profile varies monotonically from a first edge of the substrate in the region to at least a second edge of the substrate in the second region, wherein the difference in the electrical conductivity of the first and second regions is dependent on the dopant profile;
forming a passivation on a surface of the substrate; and
forming a contact structure on the surface of the substrate, wherein the contact structure includes a plurality of contacts spaced apart at a plurality of distances, which are surrounded by regions of the substrate with passivation,
wherein the plurality of distances includes at least a first distance and a second distance,
wherein the plurality of distances are defined depending on the first electrical conductivity and the second electrical conductivity,
wherein the plurality of distances vanes proportionally to the dopant profile; and
wherein the plurality of distances increases from the first edge to the second edge;
wherein the passivation is a rear-side passivation,
wherein the surface of the substrate is a rear-side of the substrate, and
wherein the contact-structure is a rear-side contact-structure.

10. A method according to claim 9, wherein the substrate includes a {100}-crystal orientation.

11. A method according to claim 9,
wherein a plurality of openings are formed in the passivation; and
wherein a respective contact is formed in a respective opening of the passivation in such a manner that the respective contact electrically contact the surface of the substrate.

12. A method according to claim 9, wherein the plurality of contacts are formed as Laser-fired contacts.

13. A method according to claim 9, wherein the passivation is structured by means of Laser-ablation.

14. A method for manufacturing a solar cell, the method including:
determining a first electrical conductivity in a first region of a substrate;
determining a second electrical conductivity in a second region of the substrate, wherein the second electrical conductivity is greater than the first electrical conductivity,
wherein the substrate includes a dopant profile, wherein the dopant profile varies monotonically from a first edge of the substrate in the first region to at least a second edge of the substrate in the second region, wherein the difference in the electrical conductivity of the first and second regions is dependent on the dopant profile;
forming a rear-side passivation on a rear-side of the substrate; and
forming a rear contact-structure on the rear-side of the substrate, wherein the rear-side contact-structure includes a plurality of rear-side contacts spaced apart at a plurality of distances, which are surrounded by regions of the substrate with rear-side passivation,
wherein the plurality of distances are defined depending on the first electrical conductivity and the second electrical conductivity,
wherein the plurality of distances varies proportionally to the dopant profile, and
wherein the plurality of distances increases from the first edge to the second edge.

* * * * *

UNITED STATES PATENT AND TRADEMARK OFFICE
CERTIFICATE OF CORRECTION

PATENT NO. : 9,502,587 B2
APPLICATION NO. : 13/956459
DATED : November 22, 2016
INVENTOR(S) : Bernd Bitnar et al.

It is certified that error appears in the above-identified patent and that said Letters Patent is hereby corrected as shown below:

In the Specification

Column 11, Line 54: delete "$10^{78}$ cm$^{-3}$" between "approximately" and "to" and write -- $10^{18}$ cm$^{-3}$ -- in place thereof.

In the Claims

Claim 9 - Column 21, Line 18: add "first" between "the" and "region".

Claim 9 - Column 21, Line 34: delete "vanes" between "distances" and "proportionally" and write -- varies -- in place thereof.

Claim 9 - Column 21, Line 35: delete ";" between "profile" and "and" and write -- , -- in place thereof.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*